United States Patent
Hempl

(10) Patent No.: US 10,234,491 B2
(45) Date of Patent: Mar. 19, 2019

(54) METHOD FOR ANALYSING A SIGNAL AND APPARATUS FOR CARRYING OUT THE METHOD

(71) Applicant: Siemens Aktiengesellschaft, Munich (DE)

(72) Inventor: Martin Hempl, Winkelhaid (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 15/578,901

(22) PCT Filed: May 20, 2016

(86) PCT No.: PCT/EP2016/061402
§ 371 (c)(1),
(2) Date: Dec. 1, 2017

(87) PCT Pub. No.: WO2016/206876
PCT Pub. Date: Dec. 29, 2016

(65) Prior Publication Data
US 2018/0172743 A1 Jun. 21, 2018

(30) Foreign Application Priority Data
Jun. 23, 2015 (EP) .................................. 15173342

(51) Int. Cl.
*G01R 23/167* (2006.01)
*G01R 23/16* (2006.01)
(Continued)

(52) U.S. Cl.
CPC .......... *G01R 23/167* (2013.01); *G01R 23/16* (2013.01); *G01H 1/003* (2013.01); *G01L 19/00* (2013.01);
(Continued)

(58) Field of Classification Search
CPC .............................. G01R 23/167; G01H 1/003
(Continued)

(56) References Cited

U.S. PATENT DOCUMENTS

| 4,686,457 A | 8/1987 | Banno |
| 2008/0027299 A1* | 1/2008 | Tobola ............... A61B 5/02416 600/323 |

(Continued)

FOREIGN PATENT DOCUMENTS

| DE | 10392151 B4 | 4/2013 |
| EP | 1843230 A1 | 10/2007 |

(Continued)

OTHER PUBLICATIONS

International Search Report dated Sep. 13, 2016, for PCT/EP2016/061402.
(Continued)

*Primary Examiner* — Ricky Ngon
(74) *Attorney, Agent, or Firm* — Beusse Wolter Sanks & Maire

(57) ABSTRACT

A method and apparatus for analyzing a signal, in which a spectrum of the signal is provided, which spectrum is the result of a multiplication of the signal by a predefined window function and a subsequent Fourier transform, the highest spectral line and the adjacent second-highest spectral line are determined in the spectrum in the region of at least one local maximum, the amplitude of the highest spectral line and of the second-highest spectral line is determined, at least one value dependent on the amplitude of the highest spectral line and on the amplitude of the second-highest spectral line is determined, a frequency correction value is determined for the frequency of the highest spectral line from the determined value using a frequency correction characteristic curve which was created for the predefined window function, and the frequency of the highest spectral line is corrected by the frequency correction value.

23 Claims, 13 Drawing Sheets

(51) Int. Cl.
  *H03M 1/12* (2006.01)
  *G01H 1/00* (2006.01)
  *G01L 19/00* (2006.01)
  *G01M 15/14* (2006.01)
  *G06F 17/14* (2006.01)

(52) U.S. Cl.
  CPC ........... *G01M 15/14* (2013.01); *G06F 17/142* (2013.01); *H03M 1/124* (2013.01)

(58) Field of Classification Search
  USPC ........................................................ 702/70
  See application file for complete search history.

(56) References Cited

U.S. PATENT DOCUMENTS

| | | |
|---|---|---|
| 2008/0122679 A1 | 5/2008 | Noda |
| 2009/0231956 A1 | 9/2009 | Schonewille |
| 2010/0066412 A1 | 3/2010 | Bode |
| 2013/0166239 A1* | 6/2013 | Ota .................... G01B 9/02084 702/70 |

FOREIGN PATENT DOCUMENTS

| | | | | |
|---|---|---|---|---|
| JP | 2006047304 A | 2/2006 | | |
| JP | 2008076152 A | 4/2008 | | |
| JP | WO 2014203708 A1 * | 12/2014 | ............. G06S 7/285 |
| WO | 03102610 A2 | 12/2003 | | |

OTHER PUBLICATIONS

EP Search Report dated Jan. 18, 2016, for EP patent application No. 15173342.5.
Lyons R, "How to interpolate in the Time-Domain by Zero-Padding in the Frequency Domain", XP002281208, Internet Citation, dspGuru—Iowegian International, URL: http://www.dspguru.com/howto/tech/zeropad.htm, Overland Park KS US, Jan. 13, 2001.

* cited by examiner

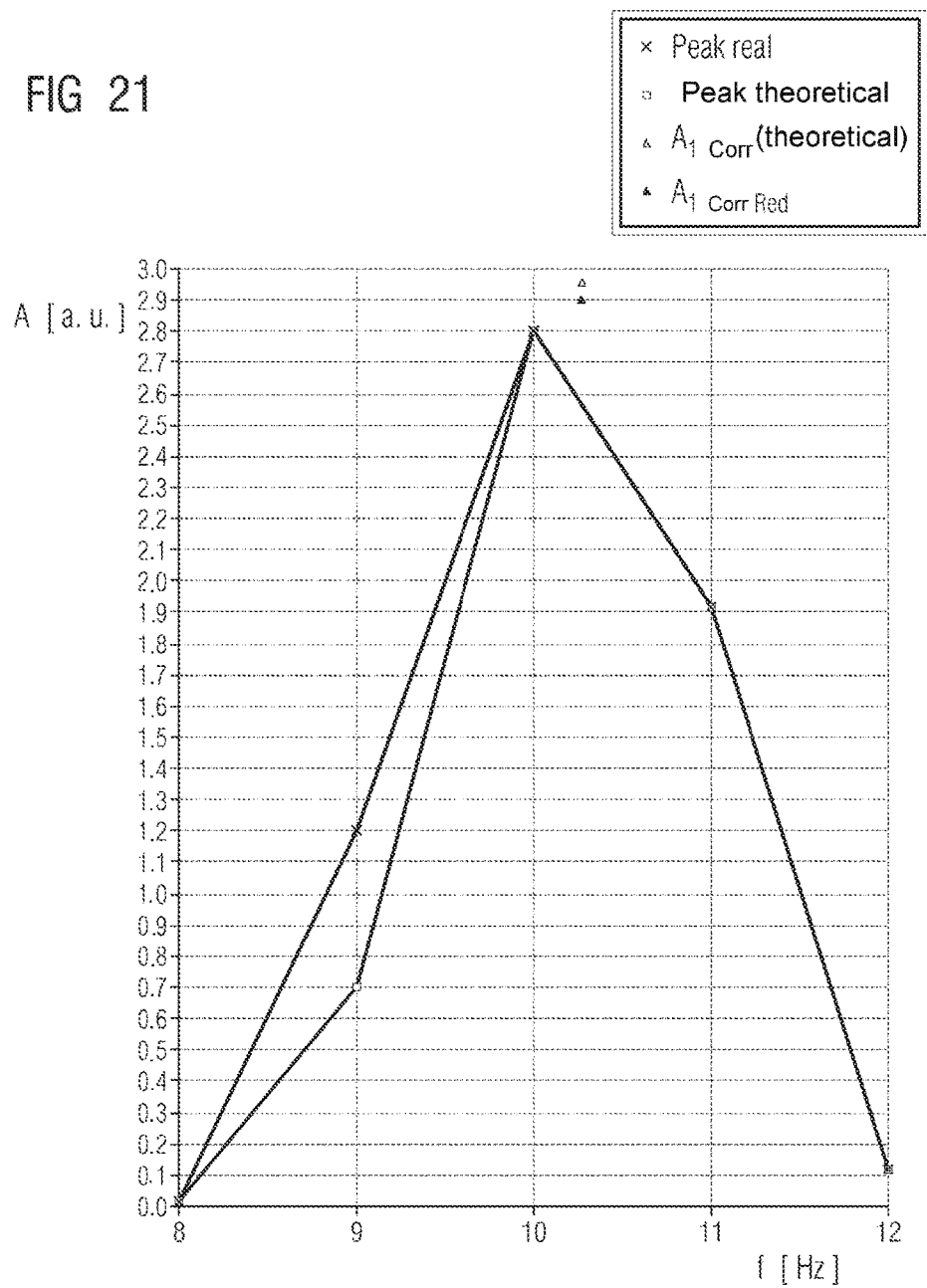

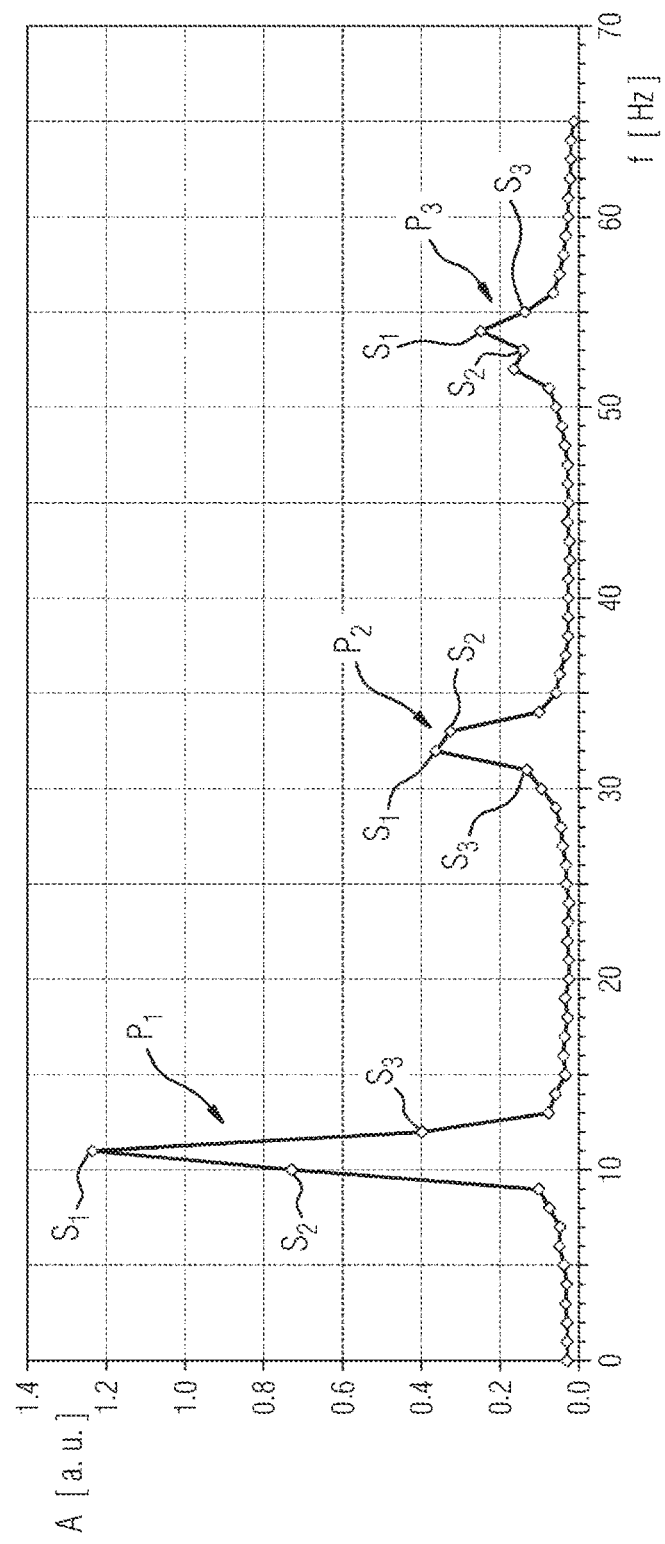

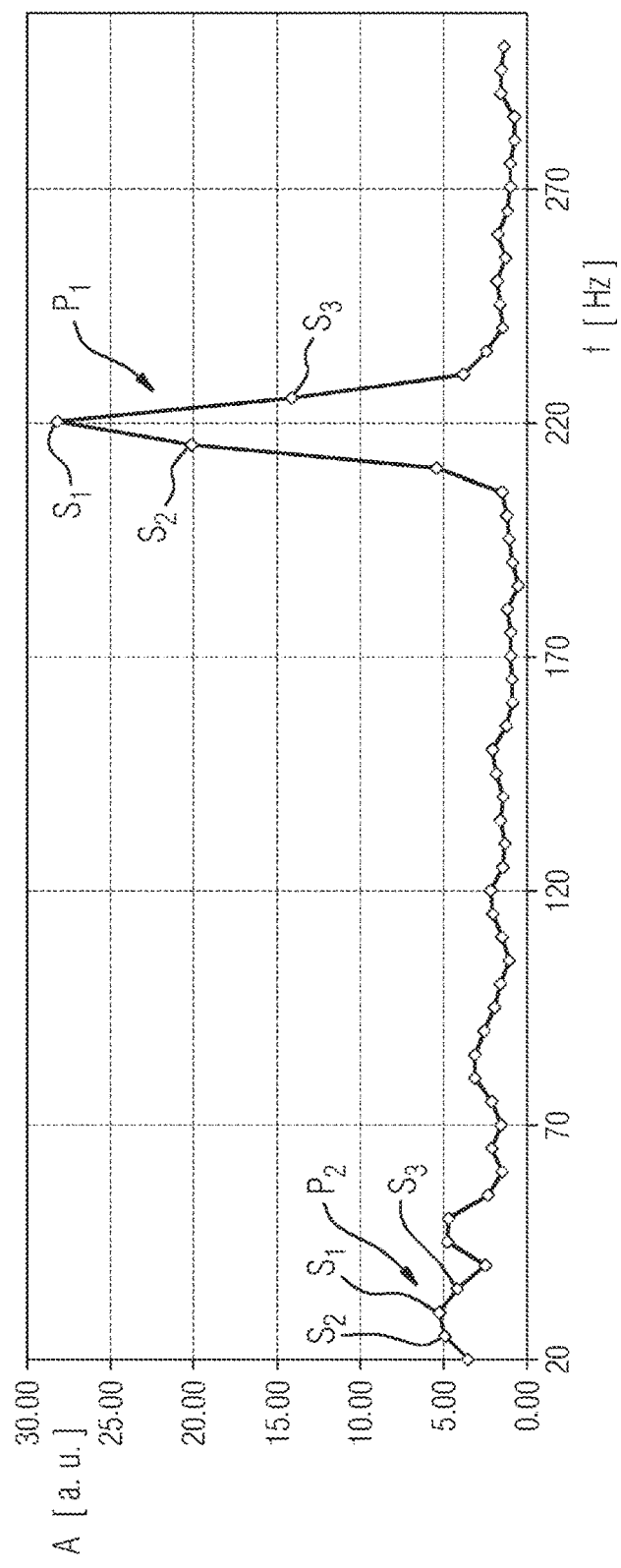

METHOD FOR ANALYSING A SIGNAL AND APPARATUS FOR CARRYING OUT THE METHOD

CROSS REFERENCE TO RELATED APPLICATIONS

This application is the US National Stage of International Application No. PCT/EP2016/061402 filed May 20, 2016, and claims the benefit thereof. The International Application claims the benefit of European Application No. EP15173342 filed Jun. 23, 2015. All of the applications are incorporated by reference herein in their entirety.

FIELD OF INVENTION

The invention relates to a method for analyzing a signal and an apparatus for carrying out such a method.

BACKGROUND OF INVENTION

Fourier transformation, in particular discrete or fast Fourier transformation, is often used for the analysis of signals with regard to their signal components. In this case, it is generally endeavored to be able to determine as accurately as possible the frequencies and amplitudes of the individual signal components of the signal to be analyzed.

This can become problematic, however, if the signals are not captured regularly enough. In such cases, recourse is had for instance to various alias corrections, in order nevertheless to be able to carry out a reliable frequency analysis. Such a method is described for instance in US 2009/0231956 A1.

When determining the frequency there is generally a limitation on account of the so-called Nyquist-Shannon sampling theorem. In accordance therewith, a signal band-limited to a maximum frequency, in order that said signal can be reconstructed exactly again from the time-discrete signal, must be sampled at a sampling frequency greater than twice the bandwidth.

In practice, all systems are restricted with regard to the possible frequency resolution. The latter can indeed be improved by longer acquisition times or by apparently longer acquisition times, for which a signal is extended with "zeros", this also being known by the designation zero padding. However, limits are imposed on the improvement, since the latter is generally associated with an increased computational complexity and/or longer measurement times.

A further problem is that, on account of the so-called leakage effect, the amplitude and/or frequency of a sinusoidal signal component contained in a signal in many cases cannot be reproduced correctly. This is attributable to the fact that there is always a finite observation period and the signal in reality fundamentally has a start time and an end time, which has the effect that frequency components which could not be found in the case of a non-realizable observation period of infinite length occur in a spectrum determined via Fourier analysis.

The leakage effect has the consequence that the amplitude and frequency of sinusoidal signal components are reproduced correctly only if the frequency lies exactly on one of the frequency lines of the spectrum. A widening of the peaks representing the signal components and a reduction of the amplitude occur in all other cases.

The use of different window functions is intended to reduce the leakage effect and to increase the amplitude accuracy for all frequency components. Window functions are functions which have the value zero outside a predefined interval. A signal to be analyzed is multiplied by the window function, such that it likewise assumes the value zero outside the predefined interval. The Fourier transformation is subsequently carried out.

In order to improve the frequency and amplitude accuracy, various procedures are known from the prior art. By way of example, peak fitting by means of parabolic, Gaussian or Lorentz curves is carried out.

Peak fitting using such curves is unsatisfactory here in some instances in practice, since the optimum curve shape is dependent on the window function used for the calculation of the spectra. Furthermore, there are a number of window functions, for example the so-called Tukey window, for which possibly no optimum curve shape can be found for fitting.

A further problem can arise as a result of noise contained in the signal or as a result of signal mixtures. By means of peak fitting, the frequency and/or amplitude of a sinusoidal component contained in the signal can then be determined only comparatively inaccurately.

SUMMARY OF INVENTION

Proceeding from the prior art mentioned above it is therefore an object of the present invention to specify a method of the type mentioned in the introduction which enables a more accurate signal analysis in conjunction with the least possible computational complexity, and an apparatus for carrying out such a method.

This object is achieved according to the invention by means of a method for analyzing a signal, in which—a spectrum of the signal to be analyzed is provided, which is the result of a multiplication of the signal to be analyzed by a predefined window function and subsequent, in particular discrete or fast, Fourier transformation,—the highest spectral line and the second-highest spectral line directly adjacent thereto are determined in the spectrum in the region of at least one local maximum,—the amplitude of the highest spectral line and the amplitude of the second-highest spectral line directly adjacent thereto are determined,—at least one value dependent on the amplitude of the highest spectral line and the amplitude of the second-highest spectral line, in particular the ratio of the amplitude of the highest spectral line to the amplitude of the second-highest spectral line and/or the ratio of the amplitude of the highest spectral line to the average value of the amplitudes of the highest and second-highest spectral lines, is determined,—a frequency correction value for the frequency of the highest spectral line is determined from the determined value, in particular ratio, using a frequency correction characteristic curve which was created for the predefined window function, and—the frequency of the highest spectral line is corrected by the frequency correction value.

In other words, the invention is based on the concept of correcting the frequency of one or more components contained in a signal or improving the estimation of the frequency of the component(s), wherein recourse is had to a characteristic curve for the window function used. Specifically, according to the invention, from the spectrum of the signal a value is determined which is determined from the amplitude of the highest and the second-highest spectral lines in the region of a local maximum, that is to say a peak, which corresponds to a component of the signal. The frequency of the highest spectral line is corrected from the value obtained and using a frequency correction characteristic curve.

The signal to be analyzed that is under consideration can be for example an equidistantly time-dependent signal or an equidistantly angle-dependent signal. Accordingly, in order to obtain the spectrum of the signal, a frequency analysis or an order analysis may be carried out or have been carried out.

In the context of the frequency analysis, the Fourier transformation of an equidistantly time-dependent signal is carried out and said transformation yields frequencies in the time domain, such that information about the number of oscillations per unit time is obtained.

The order analysis, in the context of which an equidistantly angle-dependent signal is subjected to Fourier transformation, yields frequencies in the angle domain, which are also referred to as orders. The order analysis takes place in particular in the context of the vibration analysis of rotating machines, wherein the signal is then processed depending on the rotation angle of the machine. By way of example, signals are processed every 360/16 degrees.

A frequency correction characteristic curve that is specific to the window function used is employed in the context of the method according to the invention.

In this case, it is possible to use in particular a frequency correction characteristic curve that was created for the predefined window function using two or more, in particular sinusoidal, reference signals of different frequencies.

The determined value dependent on the amplitude of the highest and second-highest spectral lines can be in particular the ratio of the amplitude of the highest spectral line to the amplitude of the second-highest spectral line and/or the ratio of the amplitude of the highest spectral line to the average value of the amplitudes of the highest and second-highest spectral lines. It is also possible to consider other values dependent on the amplitude of the highest and second-highest spectral lines.

The frequency correction characteristic curve for the predefined window function that is used according to the invention in the context of carrying out the method is created, for example, by a procedure in which—two or more, in particular sinusoidal, reference signals are provided,—each reference signal is multiplied by the window function,—each reference signal multiplied by the window function is subjected to an in particular discrete or fast Fourier transformation,—in each case the highest spectral line and the second-highest spectral line directly adjacent thereto are determined from each transformed spectrum in the region of a local maximum,—the amplitude of the highest spectral line and the amplitude of the second-highest spectral line are determined for each transformed spectrum,—at least one value dependent on the amplitude of the highest spectral line and the amplitude of the second-highest spectral line, in particular the ratio of the amplitude of the highest spectral line to the amplitude of the second-highest spectral line and/or the ratio of the amplitude of the highest spectral line to the average value of the amplitudes of the highest and second-highest spectral lines, is determined for each transformed spectrum,—the determined values, in particular ratios, are stored together with the associated frequency of the reference signals as value pairs, and—a characteristic curve is created on the basis of the value pairs.

The at least one value dependent on the amplitude of the highest spectral line and the amplitude of the second-highest spectral line, said at least one value being determined in the context of creating the frequency correction characteristic curve from the reference spectra, is expediently that at least one value which is determined in the spectrum of the signal to be analyzed for the frequency correction according to the invention. By way of example, if the ratio of the amplitude of the highest spectral line to the average value of the amplitudes of the highest and second-highest spectral lines is determined from the spectrum of the signal to be analyzed in the context of the method according to the invention, use is expediently made of a frequency correction characteristic curve in the context of whose creation the ratio of the amplitude of the highest spectral line to the average value of the amplitudes of the highest and second-highest spectral lines was likewise determined from the reference spectra.

Furthermore, provision can be made for a plurality of reference signals to be provided by a procedure in which— an in particular sinusoidal reference signal of known frequency is provided,—the reference signal is varied between the frequency of an arbitrary spectral line $f_{lineL}$ and the frequency of a spectral line adjacent thereto in order to obtain N further reference signals having the frequencies $f_n = f_{lineL} + n/N*\Delta f$ where $n=0 \ldots N$ and with the resolution $\Delta f$.

Provision can furthermore be made for the values dependent on the amplitude of the highest spectral line and the amplitude of the second-highest spectral line, said values being determined from the spectra of the reference signals, in particular the ratios of the amplitude of the highest spectral line to the amplitude of the second-highest spectral line or the ratios of the amplitude of the highest spectral line to the average value of the amplitudes of the highest and second-highest spectral lines, to be plotted in a graph against the varied frequency or against the ratio n/N or against the offset of the frequencies $n/N*\Delta f$.

By way of example, at least one fit function, in particular at least one linear fit function, is then applied to the values represented in the graph, and the at least one fit function can advantageously be used as a frequency correction characteristic curve.

A linear fit function is expedient in particular if the ratio of the amplitude of the highest spectral line to the average value of the amplitudes of the highest and second-highest spectral lines is considered as a value dependent on the amplitude of the highest spectral line and the directly adjacent second-highest spectral line.

A frequency correction characteristic curve specific to a window function can be created in a particularly suitable manner by using a plurality of in particular sinusoidal reference signals having different frequencies.

If the relationship between the amplitude ratios of the highest and second-highest spectral lines and the frequency is virtually linear or linear, in the simplest case two reference signals suffice to obtain a characteristic curve. By way of example, then from the two associated transformed spectra in each case the amplitude ratio can be determined and can be stored in each case together with the frequency of the reference signal from whose spectrum the ratio was determined, as a value pair. By way of example, a characteristic curve can then be created by a linear fit function being placed through the two value pairs in order to obtain further value pairs of amplitude ratios and frequencies, which can be used for an improved frequency determination of a signal to be analyzed.

Particularly in order to increase the accuracy, it is also possible to create more than two reference signals for the creation of a frequency correction characteristic curve for a specific window function. Even for the case where a window function is used for which it is not known how the amplitude ratio changes with the frequency, more than two value pairs are expediently determined in order to be able to determine the behavior.

A plurality of reference signals of different frequencies can be provided for example by a procedure in which a reference signal of known frequency is predefined and the reference signal is varied between the frequency of an arbitrary spectral line $f_{lineL}$ from its transformed spectrum and the frequency of a spectral line $f_{lineL+1}$ adjacent said spectral line in order to obtain N further reference signals having the frequencies $f_n=f_{lineL}+n/N*\Delta f$ where n=0 . . . N and with the resolution $\Delta f$.

The reference signal can be varied for example in N=10 steps, in particular in N=20 steps, advantageously in N=50 steps, particularly advantageously in N=100 steps.

If a variation is effected in N=10 steps, n=0 corresponds exactly to the frequency of the first spectral line, n=10 to the frequency of the succeeding spectral line and n=5 to the center between the two lines. In the same way, in the case of a variation in N=100 steps, n=0 corresponds to the frequency of the first spectral line, n=100 to the frequency of the succeeding line and n=50 to the center between the two spectral lines.

For each of the frequencies $f_n$, the reference signal is multiplied by the predefined window function for which the frequency correction characteristic curve is to be created according to the invention, and the signal obtained is subjected to Fourier transformation, in particular to a fast or discrete Fourier transformation. For each of the frequencies $f_n$, the highest and second-highest lines in the region of at least one local maximum are determined in the respective transformed spectrum. If the spectrum of the reference signal has only one local maximum representing a signal component, this local maximum is considered.

In each case the amplitude of the highest line and the second-highest line directly adjacent thereto is determined in the region of the local maximum. The ratio of the amplitudes of the highest and second-highest spectral lines and/or the ratio of the amplitude of the highest spectral line to the average value of the two spectral lines are/is formed.

The ratios are stored together with the associated frequencies as value pairs, and a characteristic curve is created from the value pairs.

The ratios obtained can be entered for example into a graph, for example versus the varied frequency or the ratio n/N or the offset of the frequencies n/N*$\Delta f$.

The points at n=0 and n=N/2 are characteristic of the window function used.

The values of the frequency correction characteristic curve are generally symmetrical with respect to the average frequency n=N/2. For a Hamming window function, for example, the values of the amplitude ratios lie on two straight lines which are symmetrical about n=N/2 if the ratio of the amplitude of the highest spectral line to the average value of the amplitudes of the highest and second-highest spectral lines is considered as the value dependent on the amplitudes of the highest and second-highest spectral lines.

In order, in a particularly convenient manner, to deduce a frequency shift for the frequency correction from an amplitude ratio which was determined from a signal to be analyzed, which frequency shift is corrected according to the invention, the fit function or the fit functions can simply be transposed, for example from the amplitude ratio over n/N to n/N over the amplitude ratio. In this case, the transposed fit function can then also serve as a frequency correction characteristic curve.

It has proved to be particularly suitable to use a sinusoidal reference signal for the creation according to the invention of a window-specific characteristic curve. Since a signal having one signal component is sufficient, a pure sinusoidal signal of the form $f(t)=a*\sin(\omega*t+\varphi)$ is particularly appropriate as a reference signal. Reference signals having a different temporal profile are likewise possible. In order that a signal is suitable as reference, it should be distinguished by at least one local maximum representing a signal component in the spectrum, said at least one local maximum being cleanly separated from adjacent components possibly present. A time-dependent rectangular signal can likewise be used, for example, provided that this condition is met. However, there are no advantages over a sinusoidal reference signal.

It has been found that the ratio of the amplitude of the highest spectral line to that of the second-highest spectral line or to the average value of the two amplitudes in the transformed spectrum for numerous window functions changes in a specific manner depending on the frequency. By way of example, a virtually linear relationship between the abovementioned ratios of the amplitudes and the frequency is present for a Hamming window function. This insight is utilized according to the invention for a more accurate determination of the frequency of signal components of a signal to be analyzed by the influence of the window function subsequently being extracted computationally. This becomes possible by virtue of the use according to the invention of the frequency correction characteristic curve which is specific to the window function used and which contains the relationship between the change in the amplitude ratios depending on the frequency.

Specifically, by means of a characteristic curve created according to the invention for the window function, from one of the abovementioned ratios of the amplitudes of the highest and second-highest spectral lines which was determined for a signal to be analyzed, the frequency offset, that is to say the offset of the actual frequency of the signal component considered with respect to the highest spectral line represented in the spectrum, can be deduced and a correction of the frequency of the highest spectral line by the offset can be effected.

By way of example, a Hamming window function or a Tukey window function or a Hanning window function or a rectangular window function is used as the window function. Window functions other than those mentioned here purely by way of example can likewise be used.

For a predefined window function, a specific frequency correction characteristic curve can be created once, to which recourse can then be had for the frequency correction of signals which are multiplied by exactly this window function in the context of the analysis. If a window function of a specific form is used for the first time, the frequency correction characteristic curve is created beforehand and then used for the correction.

Using the method according to the invention, the frequency of at least one signal component of a signal can be corrected particularly reliably with little complexity. An adaptation to different window functions can be carried out here with little complexity, wherein it is merely necessary to have recourse to the frequency correction characteristic curve respectively specific to the window function. Existing results of a conventional calculation of spectra can be used directly as an input spectrum for the method according to the invention. The computational complexity associated with carrying out the method is comparatively low here.

The signals to be analyzed, which are captured in particular in a time-dependent manner, can be for example pressure or vibration signals which are captured in the context of condition monitoring methods for monitoring an installation, such as a gas turbine, for instance. The signal components of such signals are of particular interest, wherein a more accurate determination of the frequency according to the present invention can improve the monitoring of an installation.

The frequency values conditioned using the method according to the invention can be used for example for information about the state of the installation, in particular gas turbine, for deriving messages or for repercussion on the operation of the installation.

The method according to the invention can be carried out in order to correct the frequency of one or else a plurality of signal components of a signal to be analyzed or to improve the estimation of the frequency of the component.

In this regard, one embodiment of the method according to the invention is distinguished by the fact that—in each case the highest spectral line and the second-highest spectral line directly adjacent thereto are determined in the spectrum in the region of a plurality of local maxima, in particular in the region of all local maxima,—the amplitude of the highest spectral line and the amplitude of the second-highest spectral line are determined for each local maximum,—at least one value dependent on the amplitude of the highest spectral line and the amplitude of the second-highest spectral line, in particular the ratio of the amplitude of the highest spectral line to the amplitude of the second-highest spectral line and/or the ratio of the amplitude of the highest spectral line to the average value of the amplitudes of the highest and second-highest spectral lines, is calculated for each local maximum,—a frequency correction value for the frequency of the highest spectral line is determined from the calculated value, in particular ratio, using the frequency correction characteristic curve for each local maximum, and—the frequency of the highest spectral line is corrected by the respective frequency correction value for each local maximum.

If the signal has a plurality of signal components that are sufficiently far apart in the spectrum, in particular do not overlap, the method according to the invention can also be applied in order to correct the frequencies of a plurality, in particular all, of the signal components of the signal with regard to their frequency. A sufficient distance between the components in the spectrum is dependent here, inter alia, on the window function used and the demands made in respect of accuracy.

In order to correct the frequency of a plurality of components in a signal to be analyzed, a plurality of local maxima are considered separately from one another in the transformed spectrum of the signal. Specifically, those local maxima are taken into consideration which represent signal components which are of interest for the analysis. This can involve two or more, in particular also all, signal components of a signal. For each of the local maxima considered, in the manner according to the invention the amplitude of the highest spectral line and the directly adjacent second-highest spectral line is determined and a value dependent on the amplitudes, in particular of one of the abovementioned ratios, is formed. For each local maximum considered and thus each signal component which is of interest, according to the invention a correction value is determined and the frequency of the highest line of each maximum considered is corrected.

If the frequency of the highest spectral line has been corrected in the region of at least one local maximum in the manner according to the invention, in a next step according to the invention the amplitude of this line can be corrected.

In this regard, in one development of the method according to the invention, it is provided that an amplitude correction value and/or a corrected amplitude are/is determined from the frequency correction value or the corrected frequency for the highest spectral line in the region of the at least one local maximum from the signal to be analyzed using an amplitude correction characteristic curve which was created in particular for the predefined window function using two or more reference signals of different frequencies.

An amplitude correction characteristic curve can be created for example by a procedure in which the ratio of a predefined setpoint value for the amplitude of the highest spectral line to the average value of the amplitudes of the highest and second-highest spectral lines is determined from the spectrum of each reference signal, and the determined ratios are stored together with the associated frequency of the reference signals as value pairs, and a characteristic curve is created on the basis of the value pairs.

In an expedient configuration, the spectra of those reference signals on the basis of which the frequency correction characteristic curve has already been created according to the invention can be used for the creation of the amplitude correction characteristic curve.

The ratios of setpoint value to average value that are determined from the spectra of the reference signals can furthermore be plotted in a graph against the varied frequency or against the ratio n/N or against the offset of the frequencies n/N*$\Delta$f, and a fit function can be applied to the values represented in the graph. The fit function can be in particular a second degree polynomial fit function. Furthermore, provision can be made for the fit function to be used as an amplitude correction function.

The amplitude correction according to the invention, just like the frequency correction according to the invention, can be carried out for only one signal component of a signal to be analyzed or else for a plurality, in particular all, of the signal components of a signal to be analyzed, wherein then—totally analogously to the procedure during the frequency correction—for each of the local maxima considered the amplitude of the highest spectral line is in each case corrected after the frequency thereof has been corrected.

A further embodiment of the method according to the invention is furthermore distinguished by the fact that the third-highest spectral line directly adjacent to the highest spectral line and the amplitude of said third-highest spectral line are determined from the spectra of the reference signals in each case in the region of that local maximum at which the highest and second-highest spectral lines were determined, and the distance between the amplitude of the second-highest spectral line and the amplitude of the third-highest spectral line is determined.

It can then furthermore be provided that the distances determined from the spectra of the reference signals are plotted in a graph against the varied frequency or against the ratio n/N or against the offset of the frequency n/N*$\Delta$f, and at least one, in particular linear, fit function is applied to the values represented in the graph, and the fit function is advantageously used as further amplitude correction characteristic curve.

Then, the third-highest spectral line directly adjacent to the highest spectral line and the amplitude of said third-highest spectral line are determined in the spectrum of the signal to be analyzed in the region of that local maximum at which the highest and second-highest spectral lines were determined, and the distance between the amplitude of the second-highest spectral line and the amplitude of the third-highest spectral line can be determined as actual distance value, relative to an amplitude of the highest spectral line normalized to 1, for example.

By way of example, a setpoint distance value for the distance between the amplitude of the second-highest spectral line and the amplitude of the third-highest spectral line can be determined from the fit function for the distances determined from the spectra of the reference signals and said setpoint distance value can be compared with the actual distance value.

In this case, provision can be made for the amplitude correction value and/or the corrected amplitude to be reduced to the extent to which the actual distance value deviates from the setpoint distance value.

Furthermore, the ratio of the reduced amplitude correction value to the amplitude correction value and/or the ratio of the reduced corrected amplitude to the corrected amplitude can be formed and taken into account as a quality criterion.

If the signal to be analyzed is for example not sinusoidal or has frequency components which are close together, or contains noise or measurement errors, it may be expedient, in the context of the method according to the invention, for the correction of the amplitude of the highest spectral line(s) to be corrected further in order to obtain continuously meaningful values both for signals corresponding very well and for signals corresponding very little to the assumptions underlying the method according to the invention. Signal amplitudes which do not correspond to the assumptions, e.g. pure noise, are not increased by the method.

This takes account of the circumstance that the values dependent on the amplitudes, in particular the ratios of the amplitudes of the spectral lines in the spectrum of a signal to be analyzed with superimposed further signal components, have deviations relative to the spectra of the reference signals.

For a further correction according to the invention, the amplitude of the third-highest spectral line can additionally be used, for example. In this case, according to the invention, from the spectrum of the signal to be analyzed, the distance between the amplitude of the second-highest spectral line and the amplitude of the third-highest spectral line is determined as an actual value and said distance is compared with a theoretical value, specifically with a setpoint value for the distance. In this case, according to the invention, the setpoint value can be taken in particular from a further amplitude correction characteristic curve, which was created by a procedure in which in each case the distance between the amplitude of the second-highest and third-highest spectral lines in the region of the local maximum considered was determined from the spectra of the reference signals.

Depending on the extent to which the real value, that is to say the actual value, of the distance between the amplitudes of the second- and third-highest spectral lines deviates from the setpoint value, the amplitude correction value is corrected downward, that is to say reduced. Depending on the deviation, the correction can be reduced down to zero, which corresponds to a totally uncorrected amplitude value. A continuously variable reduction of the amplitude correction between the maximum correction and no correction is thus effected.

The further correction, that is to say the reduction of the amplitude value, can be effected computationally for example by the amplitude correction value being multiplied by the ratio of the actual value to the setpoint value.

By means of the further correction by the distance between the amplitudes of the second- and third-highest spectral lines being taken into account according to the invention, particularly reliable amplitude values can be obtained according to the invention. This also holds true in particular for the case where the spectrum of the signal to be analyzed has peaks on which background noise or other signal components are increasingly superimposed.

A further embodiment of the method according to the invention is distinguished by the fact that the ratio of a predefined setpoint value for the amplitude of the highest spectral line to the respective actual value of the amplitude of the highest spectral line is determined from the spectra of the reference signals, and the determined ratios are plotted in particular in a graph against the varied frequency or against the ratio n/N or against the offset of the frequency $n/N*\Delta f$.

By way of example, from the ratios of the predefined setpoint value of the amplitude of the highest spectral line and the respective actual value of the amplitude of the highest spectral line, the minimum value and/or the maximum value of the ratio can be determined, and the maximum value can be used in particular as a plausibility criterion.

The minimum value of the ratio of setpoint value and actual value can generally be found in the graph at the location n=0. The maximum generally lies at the position n=N/2, that is to say at that frequency which lies midway between the two lines between which variation was effected.

The predefined setpoint value for the amplitude of the highest spectral line can be for example the known value of the amplitude of the reference signals, which amplitude is 1 in the simplest case.

The amplitude values conditioned using the method according to the invention—exactly like the conditioned frequency values—can be used for example for information about the state of the installation, in particular gas turbine, for deriving messages or for repercussion on the operation of the installation.

The above object is furthermore achieved by means of an apparatus for carrying out the method for analyzing a signal according to the present invention, comprising a data acquisition and evaluation device designed—to be connected to at least one sensor for recording a signal to be analyzed, in particular at least one pressure sensor and/or at least one vibration sensor,—to acquire and in particular to filter and/or to digitize a signal recorded by the at least one sensor,—to multiply the signal by a predefined window function,—to subject the signal to an in particular fast or discrete Fourier transformation in order to obtain a spectrum of the signal, wherein the data acquisition and evaluation device is designed and configured to carry out the method according to the present invention for analyzing a signal acquired by the at least one sensor.

The data acquisition and evaluation device can comprise for example a processor or else a digital signal processor card.

In one development, the apparatus according to the invention comprises at least one sensor for recording a signal to be analyzed, in particular at least one pressure sensor and/or at least one vibration sensor, which is connected to the data acquisition and evaluation device.

An apparatus designed in this way is particularly suited for carrying out the method according to the invention.

The apparatus according to the invention can be used for example for a "hum analysis" on a gas turbine or else for a vibration analysis on rotary machines.

The combustion noises of a gas turbine can be analyzed in the context of the "hum analysis". To that end, one sensor or a plurality of sensors can be provided in the combustion chamber and/or at the burners of the gas turbine in order to capture in a time-dependent manner a signal corresponding to the combustion noises. By way of example, pressure sensors, in particular alternating pressure pick-ups, can be used as sensors.

Since the pressure vibrations are also transmitted to surrounding housing parts, acceleration sensors, too, can alternatively or additionally be used for the pressure signal acquisition.

Depending on the construction of the machine, it may also be expedient to provide a combination of pressure and acceleration sensors.

For detecting the movement of machine parts for a vibration analysis, for example, displacement, speed or acceleration sensors can be used as vibration sensors.

The sensors used for recording one or more signals to be analyzed can be part of the apparatus according to the invention. Alternatively, the apparatus according to the invention can be connected to widely existing sensors, for example of an already installed state monitoring system.

The resulting pressure and/or acceleration signals recorded by the sensor or sensors can be electrically acquired in particular with high resolution with the aid of a correspondingly configured data acquisition and evaluation device of the apparatus according to the invention, which is designed and configured accordingly. A filtering and a digitization of the acquired signals can also be carried out by the data acquisition and evaluation device.

The data acquisition and evaluation device is furthermore configured and designed to multiply the signal by a predefined window function and to subject it to an in particular fast or discrete Fourier transformation. In this case, the signal can be subjected to a Fourier transformation in particular piecewise.

The obtained spectrum of the signal is then used to carry out the method according to the invention, that is to say that it is provided, and the highest spectral line and the second-highest spectral line directly adjacent thereto are determined in the spectrum in the region of at least one local maximum, and the further steps of the method according to the invention are carried out. In this case, the data acquisition and evaluation device of the apparatus according to the invention is designed and configured for carrying out the steps of the method according to the invention.

If a plurality of frequency ranges in the spectrum of the signal to be analyzed are of interest, then they can be considered separately.

For carrying out the method according to the invention, in the data acquisition and evaluation device, at least one frequency correction characteristic curve for at least one window function can be stored and in particular at least one amplitude correction characteristic curve for the at least one window function can be stored and/or the data acquisition and evaluation device is designed and configured to create at least one frequency correction characteristic curve and in particular at least one amplitude correction characteristic curve using a plurality of reference signals for the window function.

BRIEF DESCRIPTION OF THE DRAWINGS

The present invention is explained in greater detail below on the basis of an exemplary embodiment with reference to the accompanying drawing. In the drawing:

FIG. 21 shows a spectrum in which theoretical and real values are represented for comparison, and also corrected values for a theoretical signal and also a signal measured in reality, FIG. 22 shows the spectrum of a first signal to be analyzed, which was multiplied by the window function illustrated in FIG. 1 before the transformation, and FIG. 23 shows the spectrum of a second signal to be analyzed, which was multiplied by the window function illustrated in FIG. 1 before the transformation.

DETAILED DESCRIPTION OF INVENTION

Figure 1:
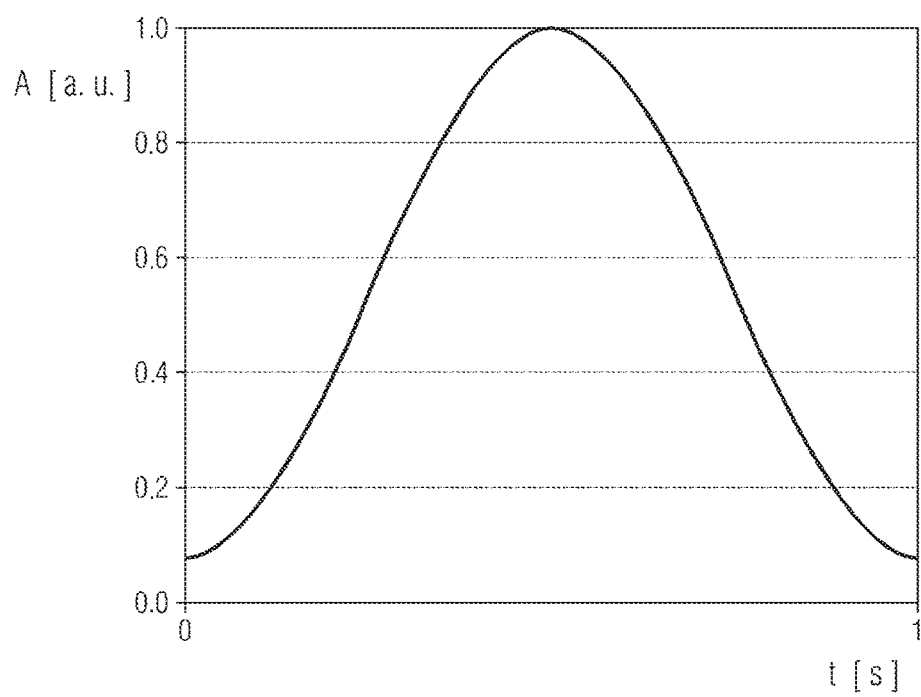
FIG. 1 shows the hamming window function used in the context of the exemplary embodiment.

FIG. 1 shows a graph illustrating a hamming window function which is used in the present exemplary embodiment of the method according to the invention.

The window function is used in a manner known per se in the context of the Fourier analysis of signals by a procedure in which a signal to be analyzed is multiplied by the window function and a Fourier transformation of the signal multiplied by the window function is carried out afterward.

The use of the window function is associated with an undesired widening of the peaks corresponding to the signal components of the signal in the spectrum and also a reduction of the amplitude.

Using the method according to the invention, the frequency and the amplitude of the signal components can be determined with higher accuracy.

To that end, according to the invention, a frequency correction characteristic curve is used, which, when a predefined window function is used for the first time, firstly has to be created. The creation of the specific frequency correction characteristic curve for the hamming window function illustrated in FIG. 1 is described in detail below. Afterward an explanation is given of how the frequency and the amplitude of one or more signal components of a signal to be analyzed are corrected according to the invention.

Figure 2:
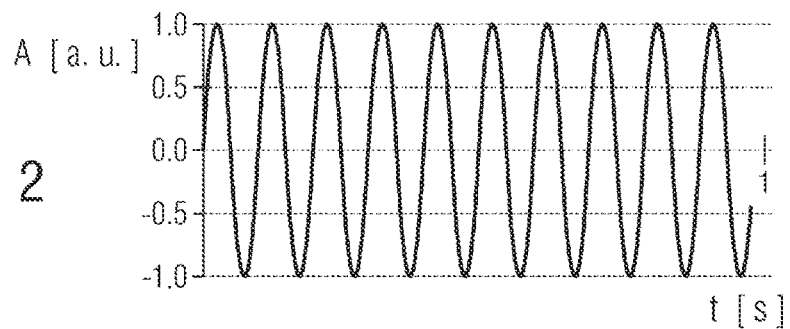
FIG. 2 shows a first sinusoidal reference signal having the frequency $f_0=10.0$ Hz.

For the creation of the frequency correction characteristic curve specific to the hamming window function in accordance with FIG. 1, a first step involves providing a plurality of sinusoidal reference signals. In the exemplary embodiment illustrated, this is done by providing a sinusoidal reference signal having a frequency of $f_0=10.0$ Hz. The corresponding sinusoidal signal is illustrated in FIG. 2, in which the amplitude A of the signal in arbitrary units is plotted against time t in seconds. The acquisition period of the signal, as can be gathered from FIG. 2, is one second.

Figure 3:
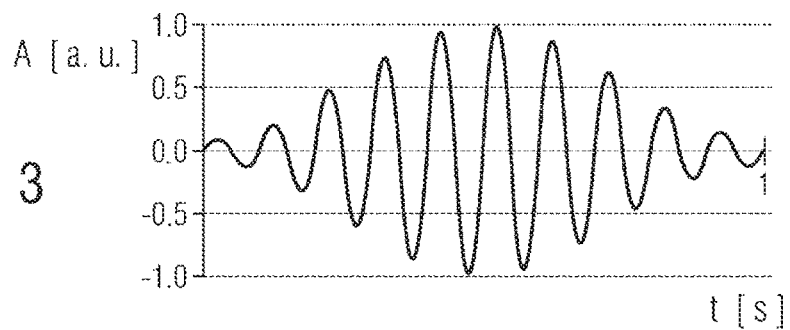
FIG. 3 shows the first reference signal from FIG. 2 multiplied by the window function from FIG. 1.
Figure 4:
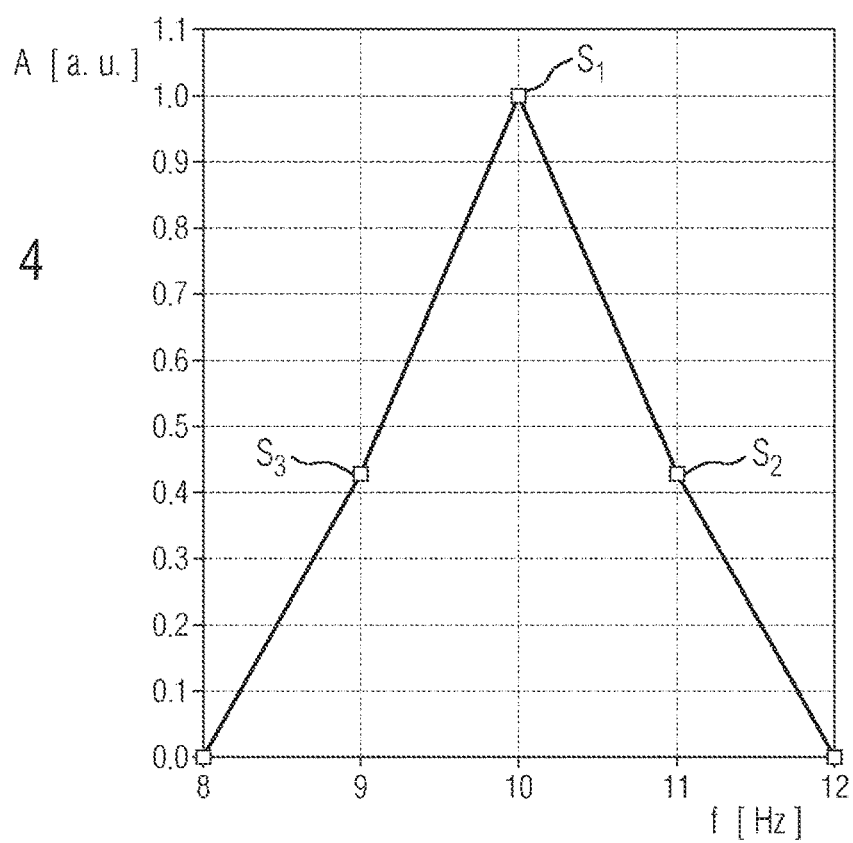
FIG. 4 shows an extract of the spectrum of the first reference signal multiplied by the window function from FIG. 1 as illustrated in FIG. 3.

The reference signal where $f_0=10.0$ Hz as illustrated in FIG. 2 is multiplied by the hamming window function shown in FIG. 1, as a result of which the signal illustrated in FIG. 3 is obtained. Afterward, the signal illustrated in FIG. 3 is subjected to a fast Fourier transformation, as a result of which the spectrum associated with the first reference signal is obtained. An extract from the spectrum for the frequency range of 8 to 12 Hz is illustrated in FIG. 4. In FIG. 4, the amplitude in arbitrary units is plotted against the frequency in Hz. FIG. 4 shows three spectral lines, a highest spectral line $S_1$ at a frequency of 10.0 Hz, a second-highest spectral line $S_2$ at a frequency of 11.0 Hz, which is directly adjacent to said highest spectral line, and a further, third-highest spectral line $S_3$ at 9.0 Hz, which is likewise directly adjacent to the highest spectral line $S_1$.

In the spectrum illustrated in FIG. 4 and also in all spectra illustrated hereinafter, the spectral lines are represented schematically by squares. Adjacent spectral lines are furthermore connected to one another by lines for the sake of better illustration, even though no values lying on the connecting lines exist between the spectral lines.

In order to compensate for the loss of energy as a result of the multiplication by the window function, the spectral lines were rescaled in a manner known per se such that the loss is compensated for again. Correction using $1/54\%$ was effected for the present window function from FIG. 1. This also applies to the spectra in FIGS. 7, 10, 13 and 16 hereinbelow.

In order to obtain further reference signals having a different frequency for the creation of the frequency correction characteristic curve for the window function from FIG. 1, the sinusoidal reference signal having the frequency $f_0=10.0$ Hz as illustrated in FIG. 2 is varied between the frequency of the spectral line $f_{lineL}$ at 10.0 Hz and the frequency of the spectral line $f_{lineL+1}$ directly adjacent thereto at the frequency 11.0 Hz.

In the exemplary embodiment illustrated, a variation takes place in N=100 steps, so as to obtain 100 further reference signals having the frequencies $f_n=f_{lineL}+n/N*\Delta f$ where $n=0 \ldots 100$ and with the resolution $\Delta f$.

The resolution $\Delta f$ is chosen as $\Delta f=1.0$ Hz in the exemplary embodiment illustrated.

Of the 100 further reference signals that are provided for the creation of the frequency correction characteristic curve in the context of the exemplary embodiment described, merely by way of example four reference signals are illustrated in FIGS. 5, 8, 11 and 14.

Figure 5:
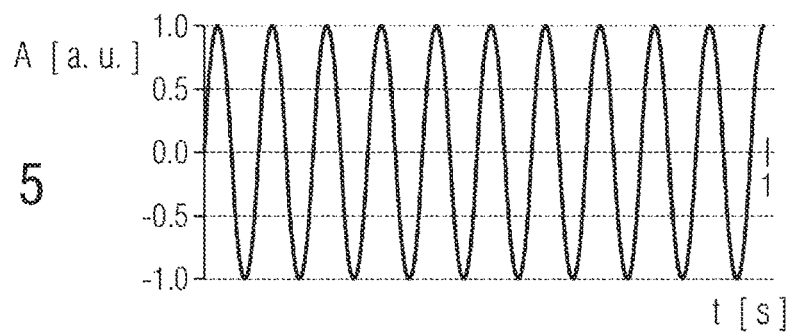
FIG. 5 shows a second sinusoidal reference signal having the frequency $f_{30}=10.3$ Hz.
Figure 6:
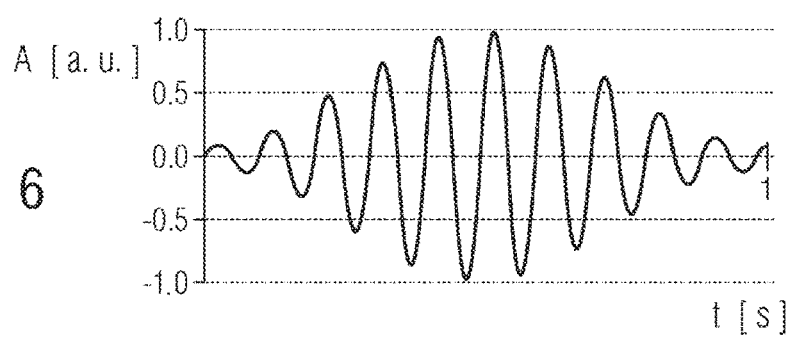
FIG. 6 shows the second reference signal from FIG. 5 multiplied by the window function from FIG. 1.
Figure 7:
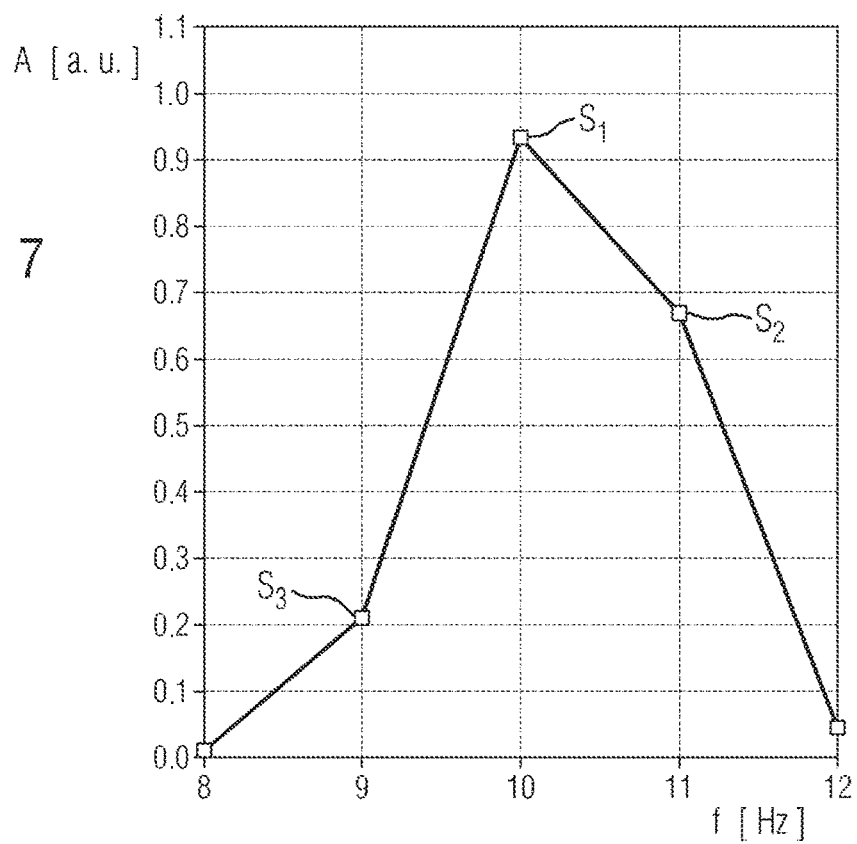
FIG. 7 shows an extract of the spectrum of the second reference signal multiplied by the window function from FIG. 1 as illustrated in FIG. 6.
Figure 8:
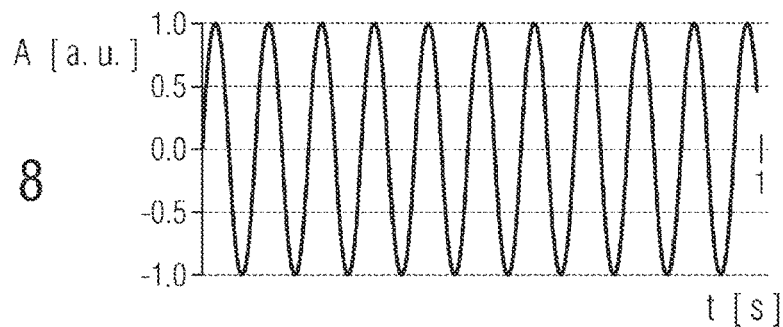
FIG. 8 shows a third sinusoidal reference signal having the frequency $f_{50}=10.5$ Hz.
Figure 9:
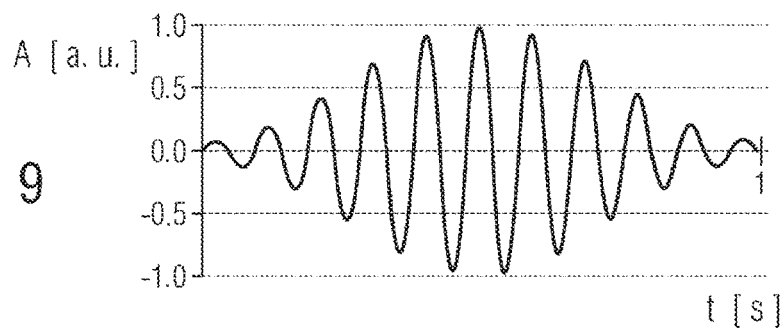
FIG. 9 shows the third reference signal from FIG. 8 multiplied by the window function from FIG. 1.
Figure 10:
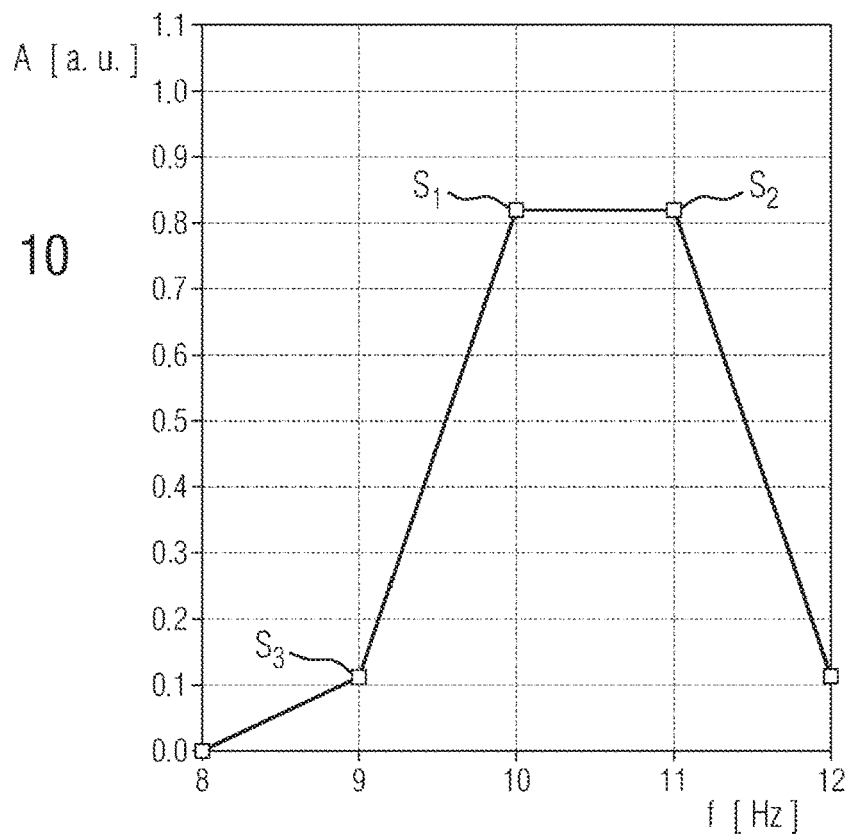
FIG. 10 shows an extract of the spectrum of the third reference signal multiplied by the window function from FIG. 1 as illustrated in FIG. 8.
Figure 11:
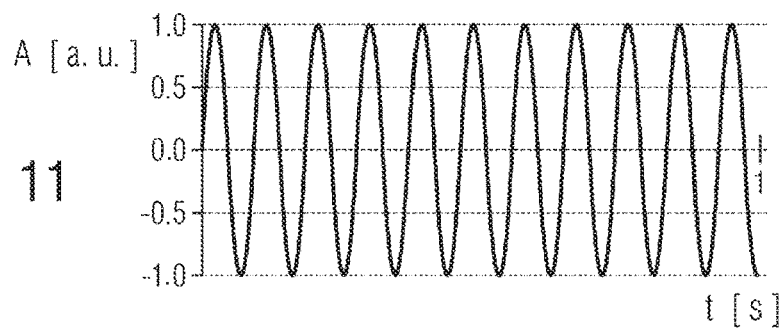
FIG. 11 shows a fourth sinusoidal reference signal having the frequency $f_{80}=10.8$ Hz.
Figure 12:
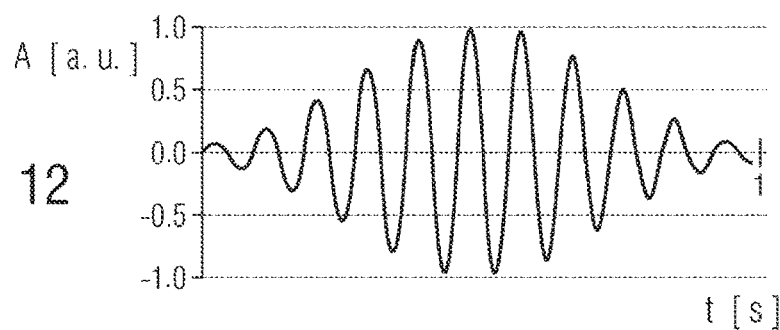
FIG. 12 shows the fourth reference signal from FIG. 11 multiplied by the window function from FIG. 1.
Figure 13:
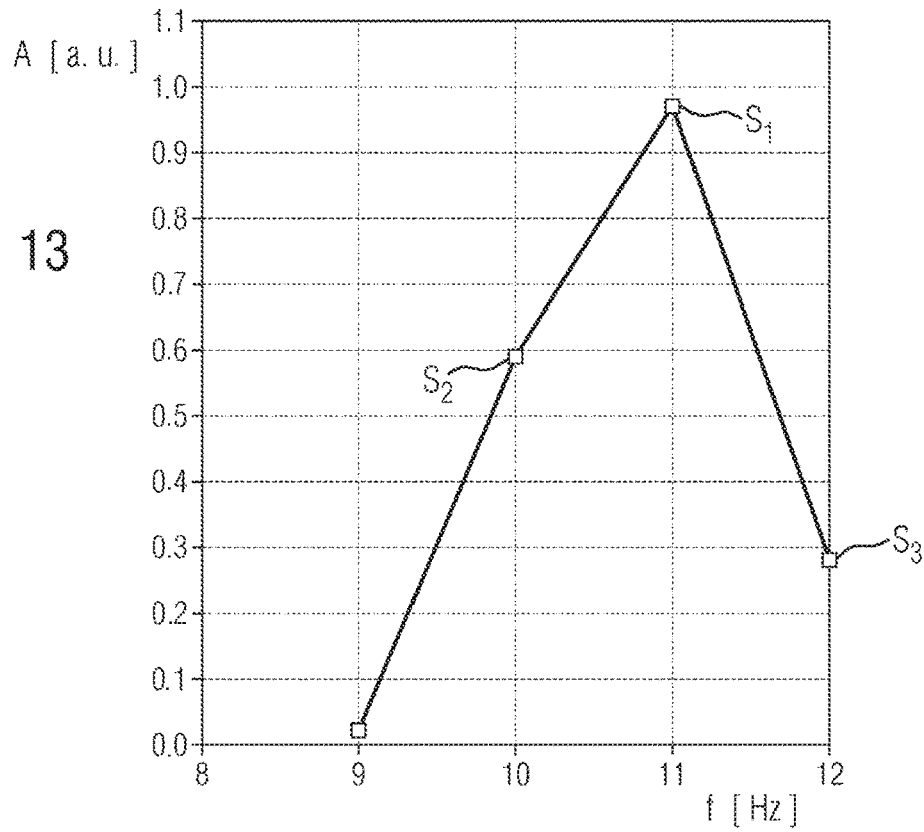
FIG. 13 shows an extract of the spectrum of the fourth reference signal multiplied by the window function from FIG. 1 as illustrated in FIG. 12.
Figure 14:
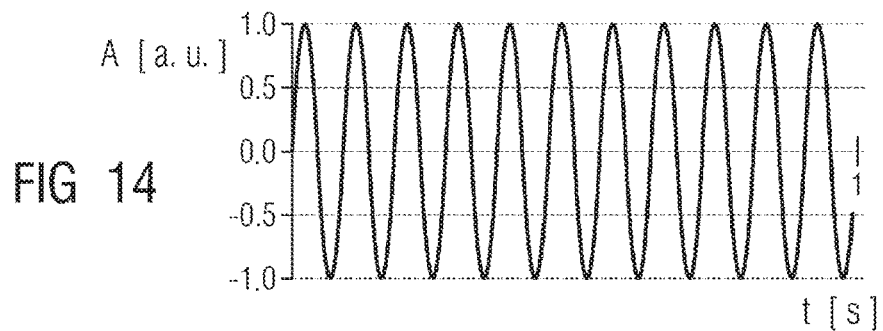
FIG. 14 shows a fifth sinusoidal reference signal having the frequency $f_{100}=11.0$ Hz.
Figure 15:
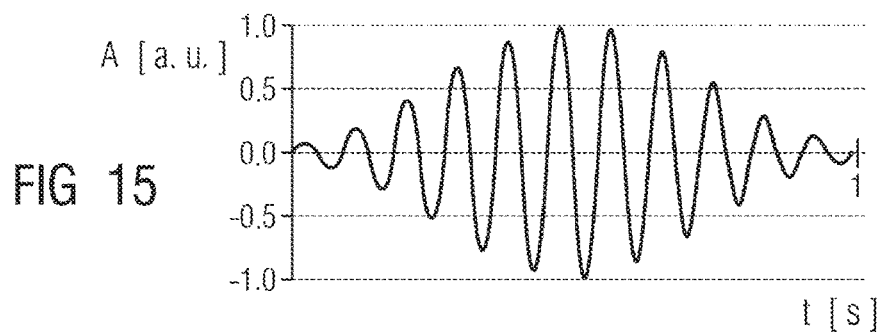
FIG. 15 shows the fifth reference signal from FIG. 14 multiplied by the window function from FIG. 1.
Figure 16:
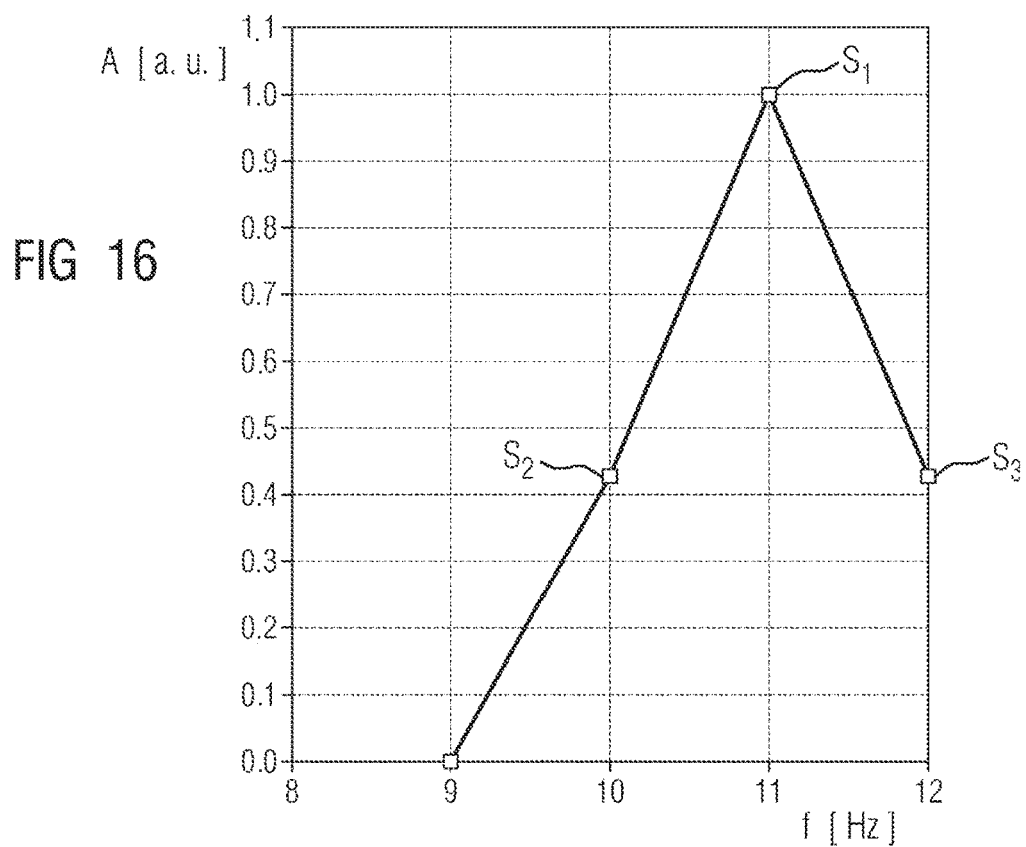
FIG. 16 shows an extract of the spectrum of the fifth reference signal multiplied by the window function from FIG. 1 as illustrated in FIG. 15.

Specifically, FIG. 5 shows a reference signal having a varied frequency of $f_{30}=10.3$ Hz, FIG. 8 shows a further reference signal having a varied frequency of $f_{50}=10.5$ Hz, FIG. 11 shows a further reference signal having a varied frequency of $f_{80}=10.8$ Hz, and FIG. 14 shows a reference signal having a varied frequency of $f_{100}=11.0$ Hz.

The reference signal illustrated in FIG. 2 thus corresponds to the variation position n=0, the signal illustrated in FIG. 8 corresponds exactly to the center between the two spectral lines, namely the position n=50, and the reference signal illustrated in FIG. 14 corresponds to the position n=100.

Each of the 100 further reference signals provided is subsequently multiplied by the window function illustrated in FIG. 1. For the reference signals illustrated by way of example in FIGS. 5, 8, 11 and 14, the result of the multiplication by the window function illustrated in FIG. 1 is illustrated in FIGS. 6, 9, 12 and 15.

Afterward, each of the 100 further reference signals multiplied by the window function illustrated in FIG. 1 is subjected to a fast Fourier transformation in order to obtain a transformed spectrum for each reference spectrum.

For the reference signals illustrated by way of example in FIGS. 5, 8, 11 and 14, extracts of the spectra obtained on account of the fast Fourier transformation—analogously to FIG. 4 for the frequency range of 8.0 to 12.0 Hz—are illustrated by way of example in FIGS. 7, 10, 13 and 16.

In a next step, in each case the highest spectral line $S_1$ and the second-highest spectral line $S_2$ adjacent thereto are determined from each of the N+1 transformed spectra in the region of the single local maximum. Furthermore, the amplitude $A_1$ of the highest spectral line $S_1$ and the amplitude $A_2$ of the adjacent second-highest spectral line $S_2$ are determined from each transformed spectrum of the reference signals.

Furthermore, the ratio of the amplitude $A_1$ of the highest spectral line $S_1$ to the average value $Avg_{12}$ of the amplitudes $A_1, A_2$ of the highest and second-highest spectral lines $S_1, S_2$ is determined for each transformed spectrum of all the reference signals. Of the values obtained here, the values for the reference signals shown by way of example in the figures, that is to say the frequencies $f_0, f_{30}, f_{50}, f_{80}$ and $f_{100}$, are contained in the following table:

| n/N [%] | $A_1$ | $A_2$ | $A_3$ | $Avg_{12}$ | $A_1/Avg_{12}$ |
|---|---|---|---|---|---|
| 0 | 1.00 | 0.43 | 0.43 | 0.71 | 1.40 |
| 30 | 0.93 | 0.67 | 0.22 | 0.80 | 1.16 |
| 50 | 0.82 | 0.82 | 0.12 | 0.82 | 1.00 |
| 80 | 0.97 | 0.59 | 0.28 | 0.78 | 1.24 |
| 100 | 1.00 | 0.43 | 0.43 | 0.71 | 1.40 |

The ratios $A_1/Avg_{12}$ determined from the spectra of all the reference signals are stored together with the respectively associated frequency $f_{n=0 \ldots 100}$ of that reference signal from whose spectrum the respective ratio was determined, as value pairs, and a characteristic curve is created on the basis of the value pairs.

Figure 17:
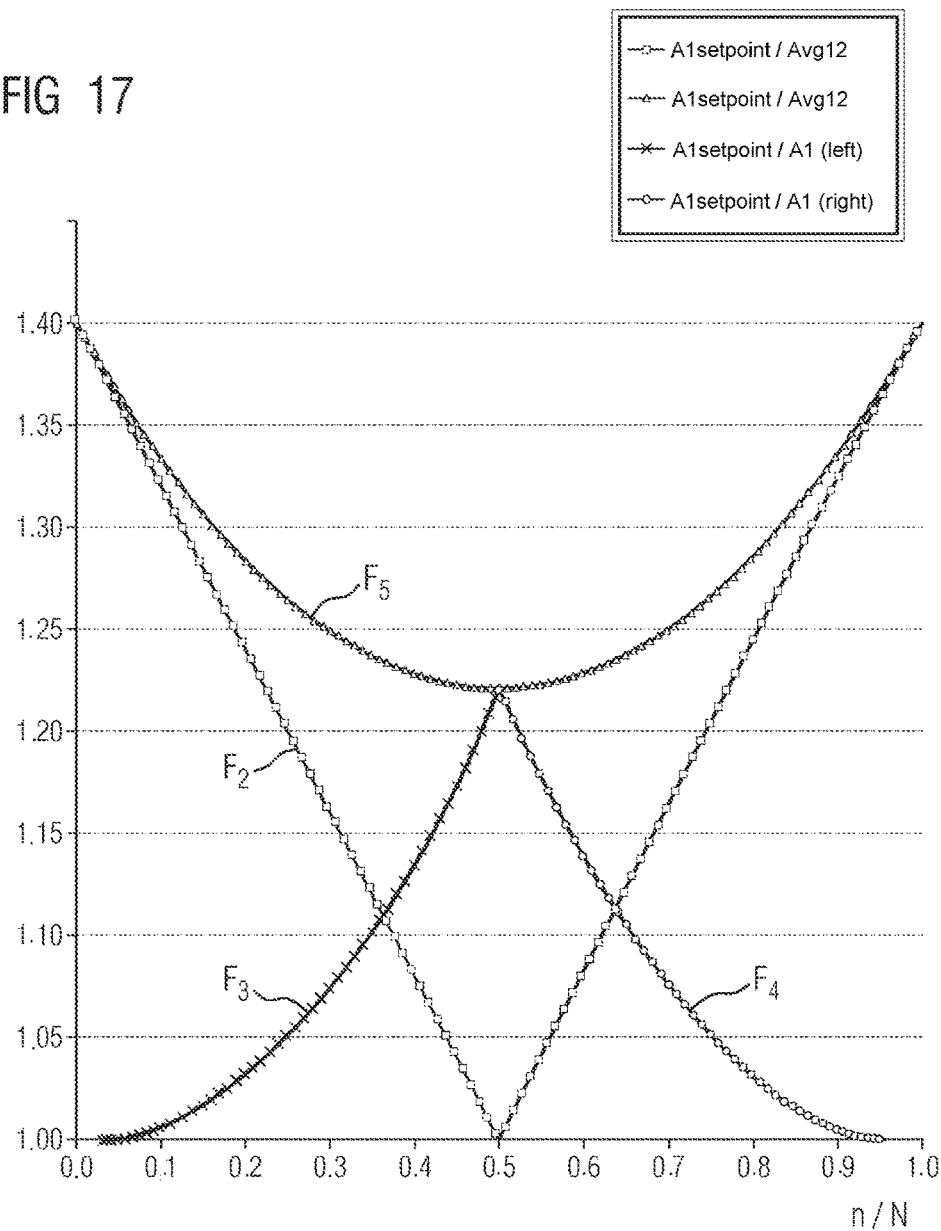
FIG. 17 shows a diagram containing various amplitude ratios against n/N and also an amplitude correction characteristic curve for the window function illustrated in FIG. 1.

For this purpose, the values obtained for $A_1/Avg_{12}$ are firstly plotted in a graph against the ratio n/N, which is illustrated in FIG. 17. The corresponding points are represented by squares in the graph in FIG. 17.

The curve on which the values for $A_1/Avg_{12}$ lie is then approximated to a good approximation with linear fit functions. As is evident from FIG. 17, the values for the ratios $A_1/Avg_{12}$ can be approximated by two straight lines that are mirrored at n=50, that is to say n/N=0.5. Accordingly, two linear fit functions are applied to the values for $A_1/Avg_{12}$ illustrated in FIG. 17. The first fit function can be determined as a regression straight line through the points from n/N=0 to n/N=0.5. The further linear fit function can be determined as a regression straight line through the points from n/N=0.5 to n/N=1.

Figure 18:
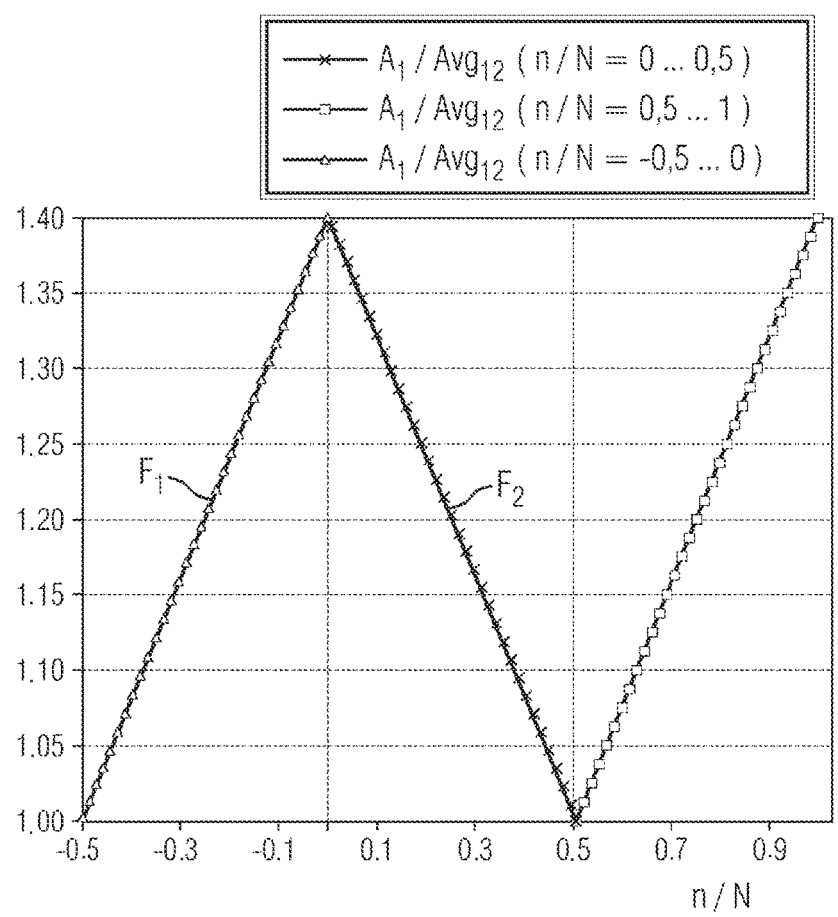
FIG. 18 shows a diagram showing one of the ratios illustrated in FIG. 17 over a wider range for n/N.

The spectral line $S_1$ at the frequency $f_{lineL}$ is the highest spectral line for n/N from −0.5 to +0.5; above that the highest line changes to the succeeding line. This is also evident from FIGS. 4, 7, 10, 13, and 16, and also FIG. 18, which shows a graph illustrating the ratio $A_1/Avg_{12}$ for the ranges n/N=0 to 0.5 and n/N=0.5 to 1 and also the range n/N=−0.5 to 0. Specifically, the corresponding values in the graph are depicted in the form of triangles for the range n/N=−0.5 to n/N=0, in the form of crosses for the range n/N=0 to n/N=0.5 and in the form of squares for the range n/N=0.5 to n/N=1. From FIG. 18, the following can be inferred about symmetry and periodicity.

For the range from n/N=−0.5 to n/N=0.5 it holds true that:

$$A_1/Avg_{12}(n/N) = A_1/Avg_{12}(-n/N)$$

$$A_1/Avg_{12}(n/N) = A_1/Avg_{12}(n/N+1)$$

Accordingly, values or functions in the range of n/N=−0.5 to n/N=0 can also be used provided that the absolute value of n/N, that is to say abs(n/N), is in the range of n/N=−0.5 to 0.5. Functions for the range n/N=0.5 to n/N=1 yield the same results as functions for n/N=−0.5 to n/N=0.

That applies to all ratios of the amplitudes $A_1$, $A_2$, $A_3$ of the highest, second-highest and third-highest spectral lines $S_1$, $S_2$, $S_3$.

Specifically, for all n/N for the range of −0.5 to 0 it holds true that:

$$f(A_1,A_2,A_3,n/N) = f(A_1,A_2,A_3,-n/N)$$

$$f(A_1,A_2,A_3,n/N) = f(A_1,A_2,A_3,n/N+1)$$

The following holds true for the linear fit functions for the range n/N=−0.5 to n/N=0

$$A_1/Avg_{12} \approx (Max(A_1/Avg_{12}) - Min(A_1/Avg_{12}))/0.5 * n/N + Max(A_1/Avg_{12})$$

and for the range n/N=0 to n/N=0.5

$$A_1/Avg_{12} \approx -(Max(A_1/Avg_{12}) - Min(A_1/Avg_{12}))/0.5 * n/N + Max(A_1/Avg_{12})$$

In the present case, for the window function from FIG. 1, there is obtained for the range of n/N=−0.5 to n/N=0 a first linear fit function $$F1: y = 0.8139x + 1.4056 \text{ where } x = n/N$$

and for the range of n/N=0 to n/N=0.5 a second linear fit function $$F2: y = -0.7971x + 1.4022 \text{ where } x = n/N$$

The following table presents the values $Max(A_1/Avg_{12})$ and $Min(A_1/Avg_{12})$ specific to a predefined window function and the associated straight line equations for the Hamming window function illustrated in FIG. 1, and also by way of example for three further window functions, specifically a Hanning window function, a Tukey 65 window function, that is to say a Tukey window function where α=0.65, which corresponds to a plateau of 35%, and a rectangular window function:

| Window function | $Max(A_1/Avg_{12})$ at n/N = 0.0 | $Max(A_1/Avg_{12})$ at n/N = 0.5 |
|---|---|---|
| Rectangular | 2.00 | 1.00 |
| Hamming | 1.40 | 1.00 |
| Tukey 65 | 1.47 | 1.00 |
| Hanning | 1.33 | 1.00 |

| Straight line equation $A_1/Avg_{12}$ as a function over n/N (−0.5 . . . 0) (if "MaxIsRight" = TRUE) | Straight line equation $A_1/Avg_{12}$ as a function over n/N (−0.5 . . . 0) (if "MaxIsRight" = FALSE) |
|---|---|
| 2.0 * n/N + 2.0 | −2.0 * n/N + 2.0 |
| 0.8 * n/N + 1.40 | −0.8 * n/N + 1.40 |
| 0.94 * n/N + 1.47 | −0.94 * n/N + 1.47 |
| 0.67 * n/N + 1.33 | −0.67 * n/N + 1.33 |

If, as an alternative to the exemplary embodiment described, instead of the Hamming window function from FIG. 1, a Hanning, Tukey 65 or rectangular window function is employed, then the corresponding values and functions are simply used.

A next step involves predefining a setpoint value for the amplitude of the highest spectral line of the spectra of all the reference signals, which setpoint value for the exemplary embodiment illustrated corresponds to the known amplitude of the reference signals, that is to say $A_{1setpoint}=1$. The value of the setpoint value $A_{1setpoint}$ divided by the actual value of the amplitude $A_1$ of the highest spectral line $S_1$ is formed from the spectrum of each reference signal, that is to say $A_{1setpoint}/A_1$ or $1/A_1$. The values obtained as a result are likewise illustrated in the graph in FIG. 17, that is to say plotted against n/N. The corresponding points are represented by crosses ($A_{1setpoint}/A_1$ (left)) for the range n/N=0 to n/N=0.5 and by circles ($A_{1setpoint}/A_1$ (right)) for the range n/N=0.5 to n/N=1.

As can be gathered from FIG. 17, the values lie on two semiparabolas to a good approximation. Once again a respective fit function for the range of n=0 . . . 50 and for the range of n=50 . . . 100 is applied to the values. For this purpose, respectively a second degree polynomial fit function is determined as a regression parabola through the points from n/N=0 to n/N=0.5 and a further second degree polynomial fit function is determined as a regression parabola through the points from n/N=50 to n/N=100.

For the exemplary embodiment illustrated, that is to say for the Hamming window function illustrated in FIG. 1, a second degree polynomial fit function F3 is obtained for the value range of n/N=0 to n/N=0.5, namely $$F3: y = 0.925x^2 - 0.0328x + 1.0008 \text{ where } x = n/N,$$

and a further second degree polynomial fit function is obtained for the range of n/N=0.5 to n/N=1

$$F4: y = 0.9666x^2 - 1.8925x + 1.9265 \text{ where } x = n/N.$$

A next step involves checking whether the minimum of the values for the ratio $A_{1setpoint}/A_1$ lies at the position n=0 and is 1.

Furthermore, a check is made to ascertain whether the maximum of the values of the ratios of $A_{1setpoint}/A_1$ lies at the position n=50 and the value of the maximum is determined. In the exemplary embodiment illustrated, the following values are obtained for the Hamming window function illustrated in FIG. 1:

$$\text{Min}(A_{1setpoint}/A_1)=1.0 \text{ at } n/N=0$$

$$\text{Max}(A_{1setpoint}/A_1)=1.22 \text{ at } n/N=0.5$$

Next, for each of the reference signals, the setpoint value $A_{1setpoint}=1$ divided by the average value between the amplitudes of the highest and adjacent second-highest spectral lines $\text{Avg}_{12}$ is calculated, that is to say $A_{1setpoint}/\text{Avg}_{12}$. The values obtained are likewise plotted in a graph against n/N. The values obtained for the Hamming window function illustrated in FIG. 1 are likewise illustrated in the graph in FIG. 17. The corresponding points are represented by triangles in FIG. 17.

The curve on which the points $A_{1setpoint}/\text{Avg}_{12}$ lie can be assumed to be a parabola to a great approximation and is likewise specific to the Hamming window function illustrated in FIG. 1. In the exemplary embodiment illustrated, the following is obtained for a second degree polynomial fit function $$F5: y=0.7081x^2-0.7083x+1.3979 \text{ where } x=n/N.$$

Afterward, the maximum value and the minimum value for $A_1/\text{Avg}_{12}$ are determined, that is to say $\text{Min}(A_{1setpoint}/\text{Avg}_{12})$ and $\text{Max}(A_{1setpoint}/\text{Avg}_{12})$. The minimum should lie at the position n=50 for $A_1/\text{Avg}_{12}=1$. The maximum that is specific to the window function should occur at the position n=0.

The corresponding values once again for the Hamming window function from FIG. 1 and the three further window functions mentioned by way of example are presented in the following table:

| Window function | $\text{Min}(A_{1setpoint}/A_1)$ at n/N = 0.0 | $\text{Max}(A_{1setpoint}/A_1)$ at n/N = 0.5 |
| --- | --- | --- |
| Rectangle | 1.00 | 1.55 |
| Hamming | 1.00 | 1.22 |
| Tukey 65 | 1.00 | 1.25 |
| Hanning | 1.00 | 1.18 |

The parabola equations for all these four window functions are contained in the following table:

| Window function | Parabola = f(n/N) where x = abs (n/N) |
| --- | --- |
| Rectangle | $A_{1setpoint}/\text{Avg}_{12} = 1.6673x^2 - 1.669x + 1.9701$ |
| Hamming | $A_{1setpoint}/\text{Avg}_{12} = 0.7081x^2 - 0.7083x + 1.3979$ |
| Tukey 65 | $A_{1setpoint}/\text{Avg}_{12} = 0.8702x^2 - 0.8705x + 1.4614$ |
| Hanning | $A_{1setpoint}/\text{Avg}_{12} = 0.6152x^2 - 0.6152x + 1.3309$ |

If at least one signal component of a time-dependently acquired signal to be analyzed is then intended to be corrected according to the invention with regard to frequency and amplitude, the following procedure is adopted.

A spectrum of the signal to be analyzed, which was obtained by the signal having been multiplied by the predefined Hamming window function from FIG. 1 and subsequently subjected to a fast Fourier transformation, is firstly provided.

A signal to be analyzed which—exactly like the reference signals illustrated in FIGS. 4, 7, 10, 13 and 16—has a pure sinusoidal shape but has a frequency of 10.27 Hz and an amplitude of 2.97 is taken as a basis for illustration purposes below.

Although the method according to the invention can be used for correcting signals of unknown frequency and amplitude, firstly the known signal mentioned above is taken as a basis for illustration purposes.

Since the signal to be analyzed has a very similar appearance to the signal illustrated in FIG. 5, the latter is not illustrated again.

The resolution of the spectrum of the signal to be analyzed—exactly as in the case of the reference signals—is $\Delta f=1.0$ Hz.

Figure 20:
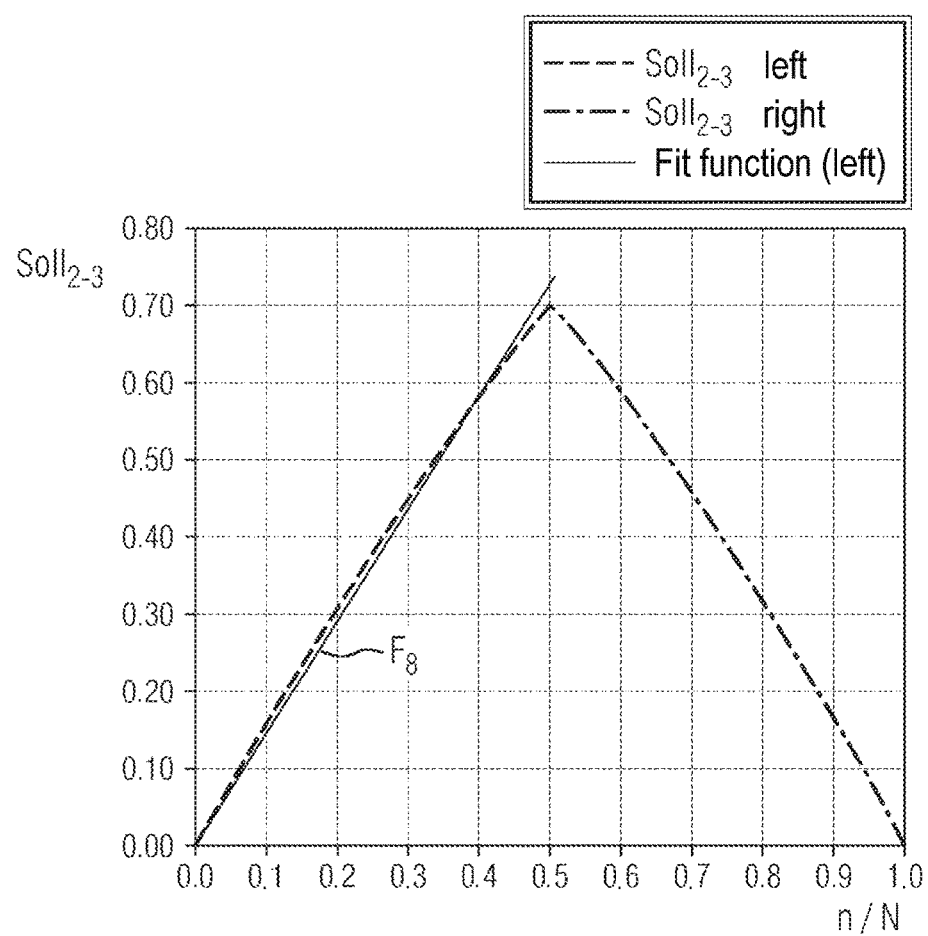
FIG. 20 shows a diagram containing a further amplitude correction characteristic curve for the window function illustrated in FIG. 1.

In the provided spectrum of the signal to be analyzed, which can be gathered from FIG. 20, in the region of the local maximum, the highest spectral line $S_1$ and the second-highest spectral line $S_2$ adjacent thereto are determined and the amplitude $A_1$ of the highest spectral line $S_1$ and the amplitude $A_2$ of the second-highest spectral line $S_2$ adjacent thereto are determined. In FIG. 20, as in FIGS. 4, 7, 10, 13 and 16, the spectral lines of the spectrum are schematically represented by squares connected by lines for illustration purposes.

Thus, the frequency of the highest spectral line $S_1$, the frequency of the second-highest spectral line $S_2$ and the frequency of the third-highest spectral line $S_3$ are also known. In the present case, 10 Hz is obtained as the frequency of the highest spectral line $S_1$, 11 Hz is obtained as the frequency of the second-highest spectral line $S_2$, and 9 Hz is obtained as the frequency of the third-highest spectral line $S_3$.

Furthermore, the third-highest spectral line $S_3$ adjacent to the highest spectral line $S_1$ is determined, and the amplitude $A_3$ of the third-highest spectral line $S_3$ is also determined.

The next step involves determining the ratio of the amplitude $A_1$ of the highest spectral line $S_1$ to the average value $\text{Avg}_{12}$ of the amplitudes $A_1$, $A_2$ of the highest and second-highest spectral lines $S_1$, $S_2$.

The following is obtained for the present example:

| $A_1$ | $A_2$ | $A_3$ | $\text{Avg}_{12}$ | $A_1/\text{Avg}_{12}$ |
| --- | --- | --- | --- | --- |
| 2.82 | 1.90 | 0.73 | 2.36 | 1.19 |

If the signal to be analyzed—in a departure from the present example of the pure sinusoidal signal—has a plurality of peaks in its spectrum, the abovementioned values can be determined for a plurality or, if desired or necessary, all of the peaks in order to correct a plurality or all of the signal components with regard to their frequency.

The determination of the spectral lines $S_1$, $S_2$ and $S_3$ and of the associated amplitudes $A_1$, $A_2$ and $A_3$ can be followed by some plausibility checking steps. Firstly, it is possible once again to check whether the highest spectral line $S_1$ actually lies between the second-highest spectral line $S_2$ and the third-highest spectral line $S_3$ and whether the associated spectral lines are successive, that is to say that no further spectral lines lie between them.

It is then possible to determine in particular special cases, too, e.g. that the highest spectral line $S_1$ lies at the frequency of 0 Hz and no adjacent spectral line $S_3$ then exists.

If that is not so, no frequency or amplitude correction according to the invention takes place.

In order to determine from the measurement values whether the frequency offset n/N is greater than 0.5 or less than 0.5, the parameter "MaxIsRight" is introduced, which can be true or false.

"MaxIsRight"=TRUE is applicable if the highest spectral line S lies to the right of the adjacent second-highest spectral line $S_2$, that is to say at higher frequencies in terms of absolute value, which is applicable for n/N greater than 0.5. If that is not so, "MaxIsRight"=FALSE is applicable, that is to say that n/N is less than 0.5. Since the frequency correction characteristic curve, as can be gathered from FIG. 17, is symmetrical with respect to n=N/2, this is utilized hereinafter for case differentiation.

Figure 19:
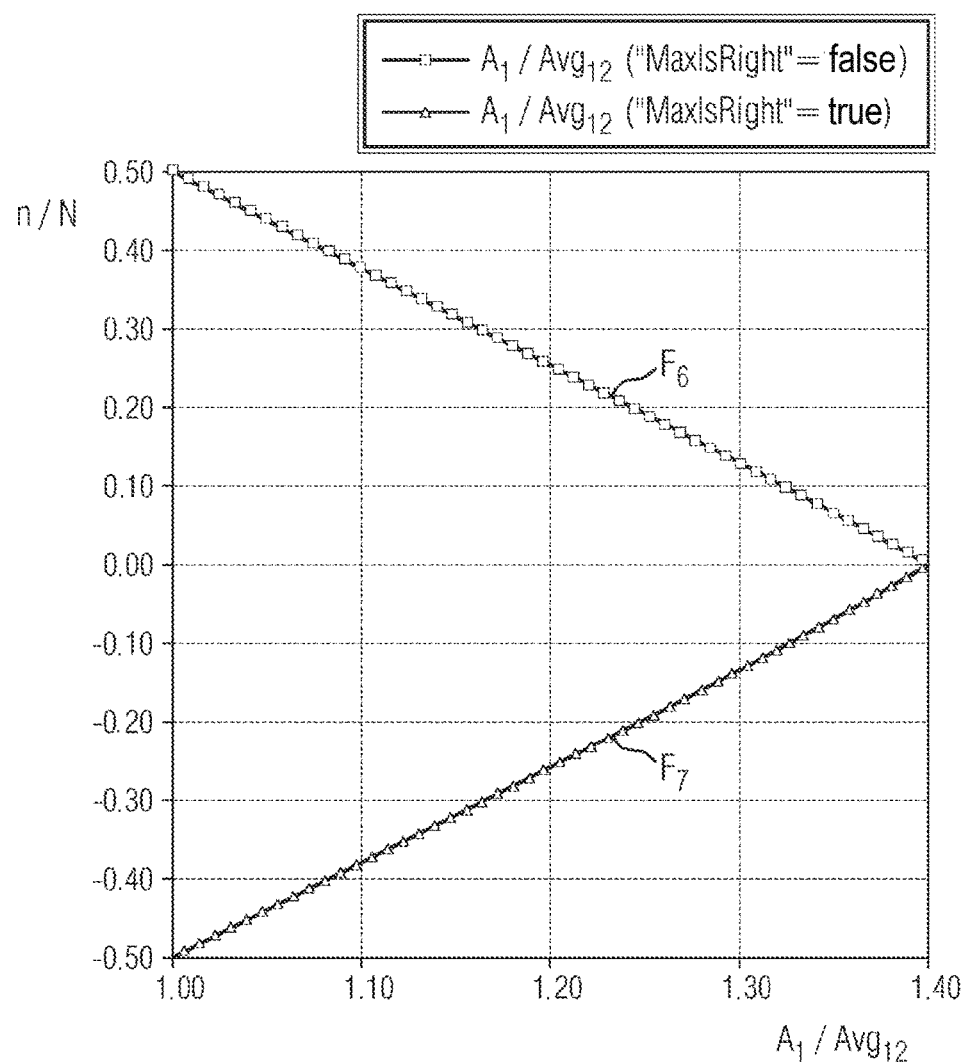
FIG. 19 shows a diagram containing a frequency correction characteristic curve for the window function illustrated in FIG. 1.

In the present case, specifically, the upper fit function F6 in FIG. 19 is obtained for the range n/N=0 to n/N=0.5, namely $$F6: y=-1.2496x+1.7527 \text{ where } x=A_1/Avg_{12}$$

and the following is obtained for the range n/N=−0.5 to n/N=0

$$F7: y=1.2496x-1.7527 \text{ where } x=A_1/Avg_{12}.$$

The following table in turn contains the corresponding transposed straight line equations for the window functions:

| Window function | Straight line equation n/N(−0.5 ... 0) as a function over $A_1/Avg_{12}$ (if "MaxIsRight" = TRUE) | Straight line equation n/N(0 ... 0.5) as a function over $A_1/Avg_{12}$ (if "MaxIsRight" = FALSE) |
|---|---|---|
| Rectangle | 0.5 * ($A_1/Avg_{12}$ − 2.00)/(1.0) or 0.5 * $A_1/Avg_{12}$ − 1.00 | −0.5 * ($A_1/Avg_{12}$ − 2.00)/(1.0) or −0.5 * $A_1/Avg_{12}$ + 1.00 |
| Hamming | 0.5 * ($A_1/Avg_{12}$ − 1.40)/(0.4) or 1.25 * $A_1/Avg_{12}$ − 1.75 | −0.5 * ($A_1/Avg_{12}$ − 1.40)/(0.4) or −1.25 * $A_1/Avg_{12}$ + 1.75 |
| Tukey 65 | 0.5 * ($A_1/Avg_{12}$ − 1.47)/(0.47) or 1.07 * $A_1/Avg_{12}$ − 1.57 | −0.5 * ($A_1/Avg_{12}$ − 1.47)/(0.47) or −1.07 * $A_1/Avg_{12}$ + 1.57 |
| Hanning | 0.5 * ($A_1/Avg_{12}$ − 1.33)/(0.33) or 1.5 * $A_1/Avg_{12}$ − 2.00 | −0.5 * ($A_1/Avg_{12}$ − 1.33)/(0.33) or −1.5 * $A_1/Avg_{12}$ + 2.00 |

In the case of the exemplary signal to be analyzed, "MaxIsRight"=FALSE is applicable since the highest spectral line S does not lie to the right of the second-highest spectral line $S_2$, but rather to the left thereof. Specifically, the frequency of $S_1$ is 10 Hz, the frequency of $S_2$ is 11 Hz and the frequency of $S_3$ is 9 Hz.

The fact that the highest spectral line $S_1$ lies to the right of $S_2$ for n/N greater than 0.5 and to the left of $S_2$ for n/N less than 0.5 is also evident from FIGS. 4, 7, 10, 13 and 16.

Owing to the dependence of the amplitude ratio $A_1/Avg_{12}$ on the frequency offset n/N, which is approximately linear for the Hamming window function from FIG. 1 (cf. FIG. 17), the frequency offset n/N governed by the window function can be deduced according to the invention from the ratio $A_1/Avg_{12}$ determined from the spectrum of the measurement signal to be analyzed.

For this purpose, the linear fit functions F1 and F2 from FIG. 17 are transposed from $A_1/Avg_{12}$ over n/N to n/N over $A_1/Avg_{12}$.

The above linear fit functions F1 and F2 are accordingly transposed to $$n/N=-0.5*(A_1/Avg_{12}-\text{Max}(A_1/Avg_{12}))/((\text{Max}(A_1/Avg_{12})-\text{Min}(A_1/Avg_{12}))$$

for the range n/N=0 to n/N=0.5, that is to say if "MaxIsRight"=FALSE, and $$n/N=0.5*(A_1Avg_{12}-\text{Max}(A_1/Avg_{12}))/((\text{Max}(A_1/Avg_{12})-\text{Min}(A_1/Avg_{12}))$$

for the range n/N=0.5 to n/N=1 and on account of the periodicity of the function for the range n/N=−0.5 to n/N=0, that is to say for "MaxIsRight"=TRUE.

The result, that is to say the transposed functions, are illustrated in FIG. 19. In FIG. 19, the values for the range n/N=0 to n/N=0.5 are entered in the form of squares and the values for the range n/N=−0.5 to n/N=0 are entered in the form of triangles.

From the ratio $A_1/Avg_{12}$ determined from the spectrum of the signal to be analyzed, a value for n/N can then be determined using the frequency correction characteristic curve from FIG. 19. In the present case, n/N=0.26 is obtained, which can also be gathered from the following table:

| $A_1$ | $A_2$ | $A_3$ | $Avg_{12}$ | $A_1/Avg_{12}$ | MaxIsRight | n/N |
|---|---|---|---|---|---|---|
| 2.82 | 1.90 | 0.73 | 2.36 | 1.19 | FALSE | 0.26 |

Finally, the frequency of the highest spectral line $S_1$, which was taken from the spectrum of the signal to be analyzed with respect to $f_{lineL}$=10 Hz is corrected according to the invention.

Specifically, the corrected frequency is estimated as $f_{ncorr}=f_{lineL}+n/N*\Delta f$ for $f_{lineL}$=10 Hz, n/N=0.26 and $\Delta f$=1 Hz, there is obtained a corrected frequency of the highest spectral line $S_1$ $$f_{ncorr}=10.26 \text{ Hz}$$

which corresponds well to the actual frequency of the signal component.

After the frequency has been corrected in the manner according to the invention, a correction of the amplitude of the spectral line according to the invention can be carried out.

To that end, a corrected amplitude is determined from the frequency correction value for the highest spectral line using an amplitude correction characteristic curve which was created for the predefined window function in accordance with FIG. 1 using the N=101 reference signals of different frequencies.

Specifically, a corrected amplitude $A_{1corrMax}$ is calculated using the frequency offset n/N=0.26 from the regression parabolas with respect to $A_{1setpoint}/Avg_{12}$, that is to say the polynomial fit function F5 from FIG. 17, which is used as an amplitude correction characteristic curve.

Specifically, the average value of the amplitude $A_1$ of the highest spectral line $S_1$ and the amplitude $A_2$ of the second-highest spectral line $S_2$, said average value being determined from the spectrum of the signal to be analyzed, multiplied by the fit function F5, is calculated:

$$A_{1corrMax} = Avg_{12measured} * F5$$

where $$F5: y = 0.7081x^2 - 0.7073x + 1.3979 \text{ where } x = n/N$$

For $n/N=0.26$ and $Avg_{12measured}=2.36$, the following is obtained for the corrected amplitude: $A_{1corrMax}=2.98$, which corresponds well to the actual amplitude of 2.97.

The method according to the invention yields, for the corrected amplitudes, values having the properties $A_{1corrMax} > A_1$.

With $A_{1corrMax} = A_1 * Max(A_{1setpoint}/A_1)$, the difference $\Delta_{A1corrMax} = A_{1corrMax} - A_1$ lies between 0 and $A_1 * (Max(A_{1setpoint}/A_1) - 1)$ and the percentage change $\Delta_{A1corrMax}/A_1$ lies between 0% and $Max(A_{1setpoint}/A_1) - 1$ (approximately 22% increase in the case of the Hamming window). The amplitude correction according to the invention, exactly like the frequency correction according to the invention, can be carried out for only one signal component of a signal to be analyzed or else for a plurality, in particular all, of the signal components of a signal to be analyzed, wherein then—totally analogously to the procedure in the frequency correction—for each of the local maxima considered in each case the amplitude of the highest spectral line is corrected after the frequency thereof has been corrected.

Particularly for signal mixtures whose components are at a sufficient distance from one another, using the method according to the invention the frequency and the amplitude of signal components can be determined particularly reliably as a result.

If these conditions apply less and less, that is to say that for example components are superimposed or background noise and measurement errors are present, and the signal to be analyzed also comprises components having a shape deviating from a sine and/or background noise, it may be advantageous to adapt the amplitude correction according to the invention.

For this purpose, the amplitudes $A_3$ of the third-highest spectral lines $S_3$ which were determined from the spectra of the 101 reference signals are used according to the invention.

In order to determine the extent to which a peak under consideration projects from the background, that is to say whether it can still be considered as a sole peak, for the predefined window function the distance $Setpoint_{2-3}$ between the amplitude $A_2$ of the second-highest spectral line and the amplitude $A_3$ of the third-highest spectral line is determined from the spectra of all the reference signals.

The values measured in reality, that is to say the values for the distance that are determined from the spectrum of a signal to be analyzed, are then compared with the theoretical values from the characteristic curve.

The distances $Setpoint_{2-3}$ determined from the spectra of the reference signals are plotted in a graph against the ratio $n/N$, and two linear fit functions are applied to the values represented in the graph.

In FIG. 20, the values for the distance $Setpoint_{2-3}$ are plotted against $n/N$—in the form of a dashed line for the range of $n/N=0$ to $n/N=0.5$ and in the form of a dash-dotted line for the range $n/N=0.5$ to $n/N=1$.

A first linear fit function F8 is applied to the values in the range of $n/N=0$ to $n/N=0.5$, and a second linear fit function is applied to the values in the range of $n/N=0.5$ to $n/N=1$. Only the first fit function F8 is illustrated in FIG. 19. The two linear fit functions are symmetrical about $n/N=0.5$ and $n/N=0$.

For the Hamming window function and the three further window functions the following holds true:

| Window function | Straight line = f(n/N) where $x = n/N$ [0 . . . +−0.5] |
|---|---|
| Rectangle | $Setpoint_{2-3} = A_{1corrMax} * abs(0.67x)$ |
| Hamming | $Setpoint_{2-3} = A_{1corrMax} * abs(1.47x)$ |
| Tukey 65 | $Setpoint_{2-3} = A_{1corrMax} * abs(1.60x)$ |
| Hanning | $Setpoint_{2-3} = A_{1corrMax} * abs(1.41x)$ |

The curve is determined in a normalized manner for $A_{1setpoint}=1$ and can then be scaled with the real $A_{1setpoint}$, that is to say with $A_{1corrMax}$. Since the ratios of the amplitudes $A_1$, $A_2$, $A_3$ of the highest, second-highest and third-highest spectral lines $S_1$, $S_2$, $S_3$ are constant for all $A_1 > 0$, the difference $A_2 - A_3$ is also proportional to $A_1$.

The correction value $\Delta A_{1corrRed} = A_{1corrMax} - A_1$ is reduced to the extent to which the theoretical distance value $Setpoint_{2-3}$ deviates from the actual distance value $Actual_{2-3}$, wherein $Actual_{2-3}$ is that distance between the amplitude $A_2$ of the second-highest spectral line $S_2$ and the amplitude $A_3$ of the third-highest spectral line $S_3$ which is determined from the spectrum of the signal to be analyzed.

A reduced correction value $\Delta A_{1corrRed}$ for the amplitude is taken as a basis, where $$\Delta A_{1corrRed} / \Delta A_{1corrMax} = Actual_{2-3}/Setpoint_{2-3} \text{ and}$$

$$(A_{1corrRed} - A_1)/(A_{1corrMax} - A_1) = Actual_{2-3}/Setpoint_{2-3}$$

$$A_{1corrRed} = A_1 + (A_{1corrMax} - A_1) * (Actual_{2-3}/Setpoint_{2-3})$$

In the present case, it is assumed that on account of non-sinusoidal components and/or noise in the spectrum of a signal measured in reality, the amplitude $A_3$ of the third-highest spectral line $S_3$ is higher than theoretically expected. This is illustrated in FIG. 21, which has the spectrum of the signal measured in reality in addition to the spectrum of the purely sinusoidal signal—considered hitherto as an example—having the frequency of 10.27 Hz and the amplitude of 2.97. The spectral lines of the real signal are schematically represented as crosses, which once again are connected by lines solely for the sake of better illustration, even though no intermediate values corresponding to the lines exist.

Specifically, the amplitude $A_3$ in the spectrum of the real signal having disturbance components is not 0.73, but rather 1.20.

The distance between the amplitude $A_2$ of the second-highest spectral line and the amplitude $A_3$ of the third-highest spectral line is thus $Actual_{2-3}=0.7$ and $Setpoint_{2-3}=1.14$.

The values resulting therefrom are presented in the following tables together with the values already discussed:

| $A_1$ | $A_2$ | $A_3$ | $Avg_{12}$ | $A_1/Avg_{12}$ | MaxIsRight | n/N |
|---|---|---|---|---|---|---|
| 2.82 | 1.90 | 1.20 | 2.36 | 1.19 | FALSE | 0.26 |

| $A_{1corrMax}/Avg_{12}$ or $A_{1setpoint}/Avg_{12}$ | $A_{1corrMax}$ or $A_{1setpoint}$ | Actual$_{2-3}$ | Setpoint$_{2-3}$ | $\Delta A_{1corrMax}$ | $\Delta A_{1corrRed}$ | $A_{1corrRed}$ |
|---|---|---|---|---|---|---|
| 1.26 | 2.98 | 0.70 | 1.14 | 0.158 | 0.097 | 2.92 |

The values $A_{1corr}$ and $A_{1corrRed}$ are likewise entered in the graph in FIG. 21, specifically in the form of a filled triangle ($A_{1corrRed}$) and a non-filled triangle ($A_{1corr}$). As is evident, the further corrected amplitude $A_{1corrRed}$ lies below the corrected amplitude $A_{1corr}$.

Afterward, the ratio of the maximum correction that theoretically occurs for the present window function from FIG. 1 and the reduced correction is determined and indicated in % as a quality value. Quality=$\Delta A_{1corrRed}/\Delta A_{1corrMax}$ For the above example, the result for the quality is as follows: Quality=0.035/0.06=62%.

In this way, it is possible to determine a measure that reproduces the degree of correspondence of the assumptions and the real situation in which measurement errors, noise and superimpositions by further signal waveforms can occur.

Finally, a plausibility check is carried out, which involves checking whether the correction value $\Delta A_{1corrRed}$ on the one hand is not negative and on the other hand is not greater than $A_1 \cdot (\text{Max}(A_{1setpoint}/A_1)-1)$. This ensures that the correction never exceeds the theoretically occurring limits.

The method according to the invention is explained below on the basis of two further examples of real signals to be analyzed.

FIG. 22 illustrates the spectrum of a rectangular signal comprising signal components of unknown frequency and amplitude. The spectrum illustrated in FIG. 21 was obtained by the time-dependently acquired rectangular signal having been multiplied by the Hamming window function illustrated in FIG. 1 and having been subjected to a fast Fourier transformation.

As can be gathered from FIG. 22, which shows a frequency range of 0 to 70 Hz, the spectrum of the rectangular signal has three peaks P1, P2, P3. The left peak P1 is at 11 Hz, the middle peak P2 is at 32 Hz and the right peak P3 is at 54 Hz.

For each of the three peaks P1, P2, P3, the highest spectral line $S_1$, the second-highest spectral line $S_2$ adjacent thereto and the third-highest spectral line $S_3$ adjacent to the highest spectral line $S_1$ are determined and the associated amplitudes $A_1$, $A_2$ and $A_3$ are determined.

The corresponding values are contained in the following table:

|  | $f_1$ | $A_1$ | $A_2$ | $A_3$ | $Avg_{12}$ | $A_1/Avg_{12}$ | MaxIsRight | n/N |
|---|---|---|---|---|---|---|---|---|
| P1 | 11 | 1.24 | 0.73 | 0.39 | 0.98 | 1.26 | TRUE | −0.18 |
| P2 | 32 | 0.365 | 0.33 | 0.133 | 0.35 | 1.05 | FALSE | 0.44 |
| P3 | 54 | 0.254 | 0.145 | 0.138 | 0.20 | 1.27 | TRUE | −0.16 |

| $f_{1corr}$ | $A_{1corrMax}/Avg_{12}$ or $A_{1setpoint}/Avg_{12}$ | $A_{1corrMax}$ or $A_{1setpoint}$ | ACTUAL$_{2-3}$ | SETPOINT$_{2-3}$ |
|---|---|---|---|---|
| 10.82 | 1.29 | 1.27 | 0.34 | 0.34 |
| 32.44 | 1.22 | 0.43 | 0.20 | 0.28 |
| 53.84 | 1.30 | 0.26 | 0.01 | 0.06 |

| $\Delta A_{1corrMax}$ | $\Delta A_{1corrRed}$ | $A_{1corrRed}$ | Quality |
|---|---|---|---|
| 0.035 | 0.035 | 1.27 | 99% |
| 0.060 | 0.043 | 0.41 | 71% |
| 0.006 | 0.001 | 0.25 | 11% |

Using the characteristic curves discussed in detail above, a corrected frequency $f_{1corr}$ and a corrected amplitude $A_{1corrMax}$ or $A_{1setpoint}$ are calculated according to the invention for the respectively highest spectral line of the three local maxima. Furthermore, the corrected amplitude for each of the three highest spectral lines is reduced according to the invention to $A_{1corrRed}$ in the manner described above and a quality value is determined. The corresponding values can be gathered from the table.

FIG. 23 illustrates the spectrum of a further time-dependently acquired signal to be analyzed. The signal to be analyzed is a pressure signal of combustion vibration which was acquired in the context of the condition monitoring of a gas turbine (not illustrated in the figures).

For carrying out the method according to the invention for analyzing the pressure signal of the gas turbine, an apparatus that is likewise not illustrated in the figures is used, which apparatus comprises a sensor for time-dependently acquiring the signal to be analyzed, said sensor being provided in the combustion chamber of the gas turbine, and also a data acquisition and evaluation device connected to the sensor.

In the present case, the pressure sensor is an alternating pressure pick-up that meteorologically captures pressure vibrations in the combustion chamber during the operation of the gas turbine.

The data acquisition and evaluation device is designed to time-dependently acquire, filter and digitize the signal recorded by the sensor, and to multiply the signal by the predefined window function from FIG. 1.

It is furthermore designed to subject the acquired signal to a fast Fourier transformation in order to obtain a spectrum of the signal.

Furthermore, the data acquisition and evaluation device is designed and configured to carry out the method according to the invention for analyzing the signal acquired by means of the sensor.

For this purpose, the frequency correction characteristic curve, the amplitude correction characteristic curve and the further amplitude correction characteristic curve for the window function illustrated in FIG. 1, the creation of which has been described in detail above, are stored in the data acquisition and evaluation device of the apparatus.

The spectrum of the pressure signal illustrated in FIG. 23 was obtained analogously to the examples already discussed by a procedure in which the pressure signal detected by the sensor of the apparatus during the operation of the gas turbine was multiplied by the Hamming window function illustrated in FIG. 1 and was subjected to a fast Fourier transformation using the data acquisition and evaluation device of the apparatus.

FIG. 23 shows the frequency range of 20 Hz to 300 Hz. In the context of the present exemplary embodiment, the largest peak P1 at a frequency of 220 Hz and the next smaller peak P2 at a frequency of 30 Hz are evaluated by means of the data acquisition and evaluation device. In this case, the values contained in the following table are obtained:

|    | $f_1$ | $\Delta f$ | $A_1$ | $A_2$ | $A_3$ | $Avg_{12}$ |
|----|----|----|-------|-------|-------|------------|
| P1 | 220 | 5 | 28.27 | 20.18 | 14.20 | 24.23 |
| P2 | 30  | 5 | 5.27  | 4.93  | 4.23  | 5.10  |

| $A_1/Avg_{12}$ | MaxIsRight | n/N | $f_{1corr}$ | $A_{1corrMax}/Avg_{12}$ or $A_{1setpoint}/Avg_{12}$ |
|----|----|----|----|----|
| 1.17 | TRUE | −0.29 | 218.53 | 1.25 |
| 1.03 | TRUE | −0.46 | 27.69  | 1.22 |

| $A_{1corrMax}$ or $A_{1setpoint}$ | $ACTUAL_{2\text{-}3}$ | $SETPOINT_{2\text{-}3}$ | $\Delta A_{1corrMax}$ | $\Delta A_{1corrRed}$ | $A_{1corrRed}$ | Quality |
|----|----|----|----|----|----|----|
| 30.30 | 5.98 | 13.14 | 2.029 | 0.923 | 29.19 | 46% |
| 6.23  | 0.70 | 4.24  | 0.961 | 0.159 | 5.43  | 17% |

Using the method according to the invention, for all of the above-discussed time-dependently acquired exemplary signals to be analyzed, the frequency and the amplitude of one or more signal components are determined particularly reliably with comparatively little computational complexity.

Even though the invention has been more specifically illustrated and described in detail by means of the preferred exemplary embodiment, nevertheless the invention is not restricted by the examples disclosed and other variations can be derived therefrom by the person skilled in the art, without departing from the scope of protection of the invention.

The invention claimed is:

1. A method for conducting signal analysis on a gas turbine for monitoring and repercussion of the gas turbine, comprising:
   acquiring, with at least one of a pressure sensor and a vibration sensor in a combustion chamber of the gas turbine, a signal to be analyzed comprising signal components of unknown frequency and amplitude, the signal indicating a value of at least one of a pressure and a vibration within the combustion chamber associated with an operation of the gas turbine,
   providing a spectrum of the signal to be analyzed, which is the result of a multiplication of the signal to be analyzed by a predefined window function and subsequent Fourier transformation,
   determining a highest spectral line ($S_1$) and a second-highest spectral line ($S_2$) directly adjacent thereto in the spectrum in the region of at least one local maximum,
   determining an amplitude ($A_1$) of the highest spectral line and an amplitude ($A_2$) of the second-highest spectral line directly adjacent thereto,
   determining at least one value dependent on the amplitude ($A_1$) of the highest spectral line ($S_1$) and the amplitude ($A_2$) of the second-highest spectral line ($S_2$), wherein the determined value is a ratio of the amplitude ($A_1$) of the highest spectral line to the amplitude ($A_2$) of the second-highest spectral line and/or wherein the determined value is a ratio of the amplitude ($A_1$) of the highest spectral line to an average value ($Avg_{12}$) of the amplitudes ($A_1$, $A_2$) of the highest and second-highest spectral lines,
   determining a frequency correction value for the frequency of the highest spectral line ($S_1$) from the determined value, using a frequency correction characteristic curve which was created for the predefined window function,
   correcting the frequency of the highest spectral line ($S_1$) of the spectrum by the frequency correction value to create a corrected frequency of the signal, and
   using the corrected frequency of the signal to determine a state of the gas turbine for repercussion on the operation of the gas turbine.

2. The method as claimed in claim 1, wherein
   in each case the highest spectral line ($S_1$) and the second-highest spectral line ($S_2$) directly adjacent thereto are determined in the spectrum in the region of a plurality of local maxima,
   the amplitude ($A_1$) of the highest spectral line ($S_1$) and the amplitude ($A_2$) of the second-highest spectral line ($S_2$) are determined for each local maximum,
   at least one value dependent on the amplitude ($A_1$) of the highest spectral line ($S_1$) and the amplitude ($A_2$) of the second-highest spectral line ($S_2$), wherein the value is at least one of the ratio of the amplitude ($A_1$) of the highest spectral line ($S_1$) to the amplitude ($A_2$) of the second-highest spectral line ($S_2$) and/or the ratio of the amplitude ($A_1$) of the highest spectral line ($S_1$) to the average value ($Avg_{12}$) of the amplitudes ($A_1$, $A_2$) of the highest and second-highest spectral lines ($S_1$, $S_2$), is calculated for each local maximum,
   a frequency correction value for the frequency of the highest spectral line ($S_1$) is determined from the calculated value, using the frequency correction characteristic curve for each local maximum, and
   the frequency of the highest spectral line ($S_1$) is corrected by the respective frequency correction value for each local maximum.

3. The method as claimed in claim 1,
   wherein a frequency correction characteristic curve is used which was created for the predefined window function using two or more reference signals of different frequencies.

4. The method as claimed in claim 3,
   wherein a frequency correction characteristic curve is created for the predefined window function by a procedure in which
   two or more reference signals are provided,
   each reference signal is multiplied by the window function,
   each reference signal multiplied by the window function is subjected to a Fourier transformation,
   in each case the highest spectral line ($S_1$) and the second-highest spectral line ($S_2$) directly adjacent thereto are determined from each transformed spectrum in the region of a local maximum, the amplitude ($A_1$) of the highest spectral line ($S_1$) and the amplitude ($A_2$) of the second-highest spectral line ($S_2$) are determined for each transformed spectrum, at least one value dependent on the amplitude ($A_1$) of the highest spectral line ($S_1$) and the amplitude ($A_2$) of the second-highest spectral line ($S_2$), wherein the value includes at least one of the ratio of the amplitude ($A_1$) of the highest spectral line ($S_1$) to the amplitude ($A_2$) of the second-highest spectral line ($S_2$) and/or the ratio of the amplitude ($A_1$) of the highest spectral line ($S_1$) to the average value ($Avg_{12}$) of the amplitudes ($A_1$, $A_2$) of the highest and second-highest spectral lines ($S_1$, $S_2$), is determined for each transformed spectrum, the determined values, are stored together with the associated frequency of the reference signals as value pairs, and a characteristic curve is created on the basis of the value pairs.

5. The method as claimed in claim 4, wherein a plurality of reference signals are provided by a procedure in which a sinusoidal reference signal of known frequency is provided, the reference signal is varied between the frequency of an arbitrary spectral line ($f_{lineL}$) and the frequency of a spectral line ($f_{lineL+1}$) adjacent thereto in order to obtain N further reference signals having the frequencies $$f_n = f_{lineL} + n/N * \Delta f$$

where n=0 ... N and with the resolution $\Delta f$.

6. The method as claimed in claim 4, wherein the values dependent on the amplitude ($A_1$) of the highest spectral line ($S_1$) and the amplitude ($A_2$) of the second-highest spectral line ($S_2$), said values being determined from the spectra of the reference signals, wherein values include at least one of the ratios of the amplitude ($A_1$) of the highest spectral line ($S_1$) to the amplitude ($A_2$) of the second-highest spectral line ($S_2$) and/or the ratios of the amplitude ($A_1$) of the highest spectral line ($S_1$) to the average value ($Avg_{12}$) of the amplitudes ($A_1$, $A_2$) of the highest and second-highest spectral lines ($S_1$, $S_2$), are plotted in a graph against the varied frequency ($f_n$) or against the ratio n/N or against the offset of the frequencies n/N*$\Delta f$.

7. The method as claimed in claim 6, wherein at least one fit function (F1, F2), is applied to the values represented in the graph, wherein the at least one fit function (F1, F2) is preferably used as a frequency correction characteristic curve.

8. The method as claimed in claim 4, wherein the amplitude correction characteristic curve is created by a procedure in which the ratio of a predefined setpoint value for the amplitude ($A_{1setpoint}$) of the highest spectral line ($S_1$) to the average value ($Avg_{12}$) of the amplitudes ($A_1$, $A_2$) of the highest and second-highest spectral lines ($S_1$, $S_2$) is determined from the spectrum of each reference signal, and the determined ratios are stored together with the associated frequency of the reference signals as value pairs, and a characteristic curve is created on the basis of the value pairs.

9. The method as claimed in claim 8, wherein the ratios determined from the spectra of the reference signals are plotted in a graph against the varied frequency ($f_n$) or against the ratio n/N or against the offset of the frequencies n/N*$\Delta f$, and a fit function (F5) is applied to the values represented in the graph, wherein the fit function is preferably used as an amplitude correction function.

10. The method as claimed in claim 8, wherein the third-highest spectral line ($S_3$) directly adjacent to the highest spectral line ($S_1$) and the amplitude ($A_3$) of said third-highest spectral line are determined from the spectra of the reference signals in each case in the region of that local maximum at which the highest and second-highest spectral lines ($S_1$, $S_2$) were determined, and the distance between the amplitude ($A_2$) of the second-highest spectral line ($S_2$) and the amplitude ($A_3$) of the third-highest spectral line ($S_3$) is determined.

11. The method as claimed in claim 10, wherein the distances determined from the spectra of the reference signals are plotted in a graph against the varied frequency ($f_n$) or against the ratio n/N or against the offset of the frequency n/N*f, and at least one fit function (F8) is applied to the values represented in the graph, and the fit function (F8) is preferably used as further amplitude correction characteristic curve.

12. The method as claimed in claim 11, wherein the third-highest spectral line ($S_3$) directly adjacent to the highest spectral line ($S_1$) and the amplitude ($A_3$) of said third-highest spectral line are determined in the spectrum of the signal to be analyzed in the region of that local maximum at which the highest and second-highest spectral lines ($S_1$, $S_2$) were determined, and the distance between the amplitude ($A_2$) of the second-highest spectral line ($S_2$) and the amplitude ($A_3$) of the third-highest spectral line ($S_3$) is determined as actual distance value ($Actual_{2-3}$).

13. The method as claimed in claim 12, wherein a setpoint distance value ($Setpoint_{A2-A3}$) for the distance between the amplitude ($A_2$) of the second-highest spectral line ($S_2$) and the amplitude ($A_3$) of the third-highest spectral line ($S_3$) is determined from the fit function (F8) and is compared with the actual distance value ($Actual_{A2-A3}$).

14. The method as claimed in claim 13, wherein the amplitude correction value and/or the corrected amplitude are/is reduced to the extent to which the actual distance value ($Actual_{A2-A3}$) deviates from the setpoint distance value ($Setpoint_{A2-A3}$).

15. The method as claimed in claim 14, wherein the ratio of the reduced amplitude correction value to the amplitude correction value and/or the ratio of the reduced corrected amplitude to the corrected amplitude are/is formed and taken into account as a quality criterion.

16. The method as claimed in claim 4, wherein the ratio of a predefined setpoint value ($A_{1setpoint}$) for the amplitude of the highest spectral line ($S_1$) to the respective actual value ($A_{1actual}$) of the amplitude of the highest spectral line ($S_1$) is determined from the spectra of the reference signals, and the determined ratios are plotted in a graph against the varied frequency ($f_n$) or against the ratio n/N or against the offset of the frequency n/N*f.

17. The method as claimed in claim 16, wherein, from the ratios of the predefined setpoint value ($A_{1setpoint}$) of the amplitude of the highest spectral line ($S_1$) and the respective actual value of the amplitude ($A_{1actual}$) of the highest spectral line ($S_1$), the minimum value and/or the maximum value of the ratio are/is determined, and the maximum value is used as a plausibility criterion.

18. The method as claimed in claim 1,
wherein an amplitude correction value and/or a corrected amplitude are/is determined from the frequency correction value or the corrected frequency for the highest spectral line ($S_1$) in the region of the at least one local maximum from the signal to be analyzed using an amplitude correction characteristic curve which was created for the predefined window function using two or more reference signals of different frequencies.

19. The method as claimed in claim 1,
wherein the reference signal is varied in N steps where N is selected in a range from about 10 steps to about 100 steps.

20. The method as claimed in claim 1,
wherein a Hamming window function or a Tukey window function or a Hanning window function or a rectangular window function is used as the window function.

21. An apparatus for carrying out the method for conducting signal analysis on the gas turbine for monitoring and repercussion of the gas turbine as claimed in claim 1, comprising:
a data acquisition and evaluation device designed to be connected to the at least one sensor for recording the signal to be analyzed, said at least one sensor including the at least one pressure sensor and/or at least one vibration sensor,
to acquire and to filter and/or to digitize the signal recorded by the at least one sensor,
to multiply the signal by a predefined window function,
to subject the signal to a Fourier transformation in order to obtain a spectrum of the signal,
wherein the data acquisition and evaluation device is designed and configured for analyzing a signal acquired by the at least one sensor to correct the frequency of one or a plurality of signal components of the signal, wherein the corrected frequency is used for monitoring and repercussion of the gas turbine.

22. The apparatus as claimed in claim 21,
wherein the at least one sensor for recording a signal to be analyzed comprises the at least one pressure sensor and/or at least one vibration sensor, which is connected to the data acquisition and evaluation device.

23. The method as claimed in claim 1,
wherein the repercussion on the operation of the gas turbine comprises an action or effect given or exerted on the gas turbine.

* * * * *